(12) United States Patent
English et al.

(10) Patent No.: US 12,008,237 B2
(45) Date of Patent: Jun. 11, 2024

(54) MEMORY BIT CELL WITH HOMOGENEOUS LAYOUT PATTERN OF BASE LAYERS FOR HIGH DENSITY MEMORY MACROS

(71) Applicant: Advanced Micro Devices, Inc., Santa Clara, CA (US)

(72) Inventors: Kurt M. English, Boxborough, MA (US); Charwak Suresh Apte, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/724,123

(22) Filed: Apr. 19, 2022

(65) Prior Publication Data
US 2023/0333742 A1 Oct. 19, 2023

(51) Int. Cl.
*G11C 5/02* (2006.01)
*G06F 3/06* (2006.01)
*G11C 11/419* (2006.01)

(52) U.S. Cl.
CPC ............ *G06F 3/061* (2013.01); *G06F 3/0655* (2013.01); *G06F 3/0679* (2013.01); *G11C 11/419* (2013.01)

(58) Field of Classification Search
CPC ...... G06F 3/061; G06F 3/0655; G06F 3/0679; G11C 11/419
See application file for complete search history.

(56) References Cited

U.S. PATENT DOCUMENTS

| | | | |
|---|---|---|---|
| 6,549,987 B1 | 4/2003 | Rappoport et al. | |
| 8,595,663 B1* | 11/2013 | Lu | G06F 30/398 |
| | | | 716/110 |
| 8,645,893 B1 | 2/2014 | Yeung et al. | |
| 9,275,721 B2 | 3/2016 | Chen et al. | |
| 9,575,891 B2 | 2/2017 | Riley et al. | |
| 10,056,390 B1* | 8/2018 | Liaw | H01L 29/1054 |
| 2016/0077940 A1* | 3/2016 | Son | G06F 11/1048 |
| | | | 714/6.22 |
| 2018/0358408 A1* | 12/2018 | Lee | G11C 11/005 |
| 2022/0093503 A1 | 3/2022 | Wuu et al. | |
| 2022/0093504 A1 | 3/2022 | Schultz et al. | |
| 2022/0115388 A1* | 4/2022 | Hirose | G11C 11/412 |
| 2023/0253035 A1* | 8/2023 | Fujiwara | G11C 11/412 |
| | | | 365/154 |

* cited by examiner

*Primary Examiner* — Min Huang
(74) *Attorney, Agent, or Firm* — Kowert, Hood, Munyon, Rankin & Goetzel, P.C.; Rory D. Rankin

(57) ABSTRACT

An apparatus and method for designing memory macro blocks. A memory includes one or more memory banks, each with one or more arrays and input/output (I/O) blocks used to perform read accesses and write accesses. An array that utilizes multiple memory bit cells, and the I/O blocks are placed in a manner that they are abutting one another. The layout of the memory bit cells and the I/O blocks use a same subset of parameters of a semiconductor fabrication process. As a result, the memory bank does not include the placement of any boundary cells, which are used to improve yield of semiconductor layout. By skipping the use of the boundary cells, the dimensions of the memory bank are reduced, and layout density increases. Additionally, the memory bit cells use one or more p-type devices for one or more read pass gates.

20 Claims, 13 Drawing Sheets

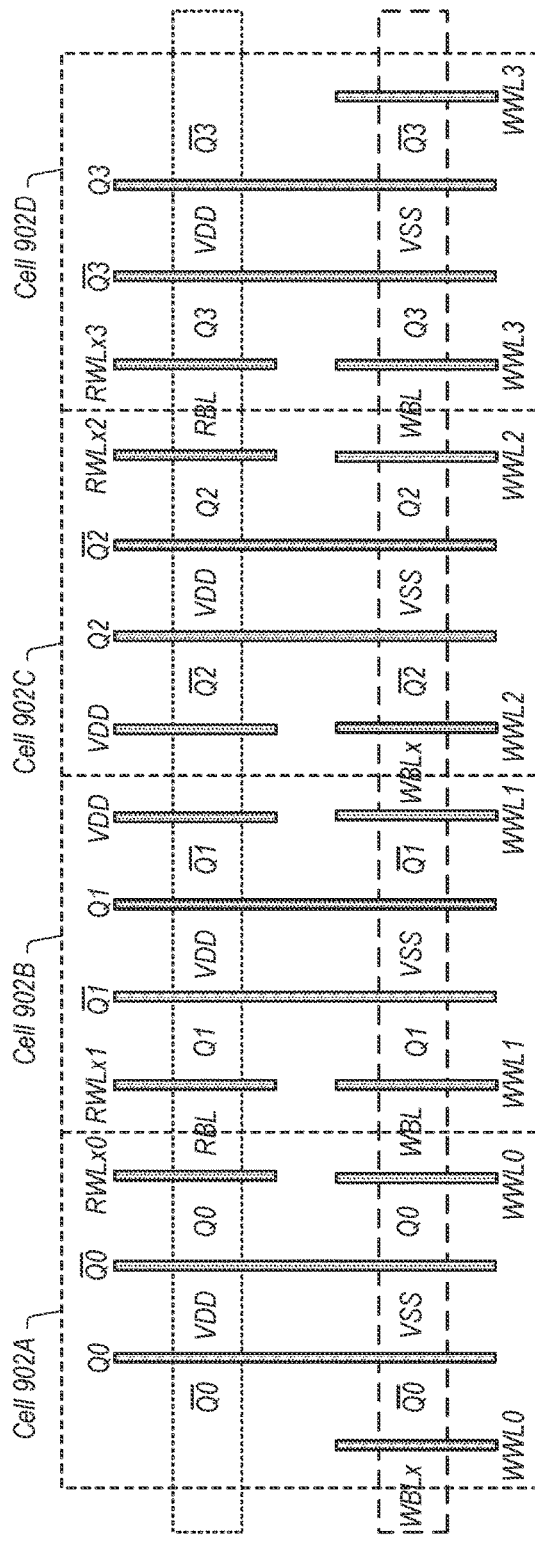
FIG. 9

MEMORY BIT CELL WITH HOMOGENEOUS LAYOUT PATTERN OF BASE LAYERS FOR HIGH DENSITY MEMORY MACROS

BACKGROUND

Description of the Relevant Art

Generally speaking, a variety of semiconductor chips include at least one processing unit coupled to a memory. The processing unit processes instructions (or commands) by fetching instructions and data, decoding instructions, executing instructions, and storing results. The processing unit sends memory access requests to the memory for fetching instructions, fetching data, and storing results of computations. Examples of the processing unit are a central processing unit (CPU), an application specific integrated circuit (ASIC), a field programmable gate array (FPGA), a multimedia engine, and a processing unit with a highly parallel microarchitecture such as a graphics processing unit (GPU) and a digital signa processor (DSP). In some designs, the processing unit and the memory are on a same die such as a system-on-a-chip (SOC), whereas, in other designs, the processing unit and the memory are on different dies within a same package such as a multi-chip-module (MCM) or in a system in a package (SiP). Static random access memory (SRAM) is commonly used as the memory. The SRAM includes an array of many memory bit cells and surrounding circuitry used for accessing values stored in the array.

The die or the package can include other units or components in addition to the processing unit and the memory. The dimensions of the individual components have limits in order to place all of the components on a same die or a same package. A floorplan of a semiconductor die (or die) is a graphical representation of the partitioning of the die. The partitioning uses shapes, such as rectangles, to represent the placement of multiple components such as one or more processing units, one or more blocks of memory that includes data storage cells and access circuitry cells, one or more interface units, and so forth. The components are often referred to as macro blocks or macros. The shapes used for the floorplan have dimensions of the macro blocks they represent.

The dimensions of the shapes have limits in order to place all of the components on the same die. The limits are set by various factors such as placement of standard cells from a standard library, the height and width of memory macro blocks, and so forth. For several types of memory, the dimensions exceed limits for efficient placement, and consequently, interfere with the placement of other components. In some cases, the other components do not even fit within the same die or the same package. The resulting chip is rendered inoperable without significant redesign, or fails to achieve lower power consumption and higher performance design targets.

In view of the above, efficient methods and apparatuses for designing memory macro blocks are desired.

BRIEF DESCRIPTION OF THE DRAWINGS

FIG. 9 is a generalized diagram of semiconductor layout of adjacent memory bit cells.

Figure 1:
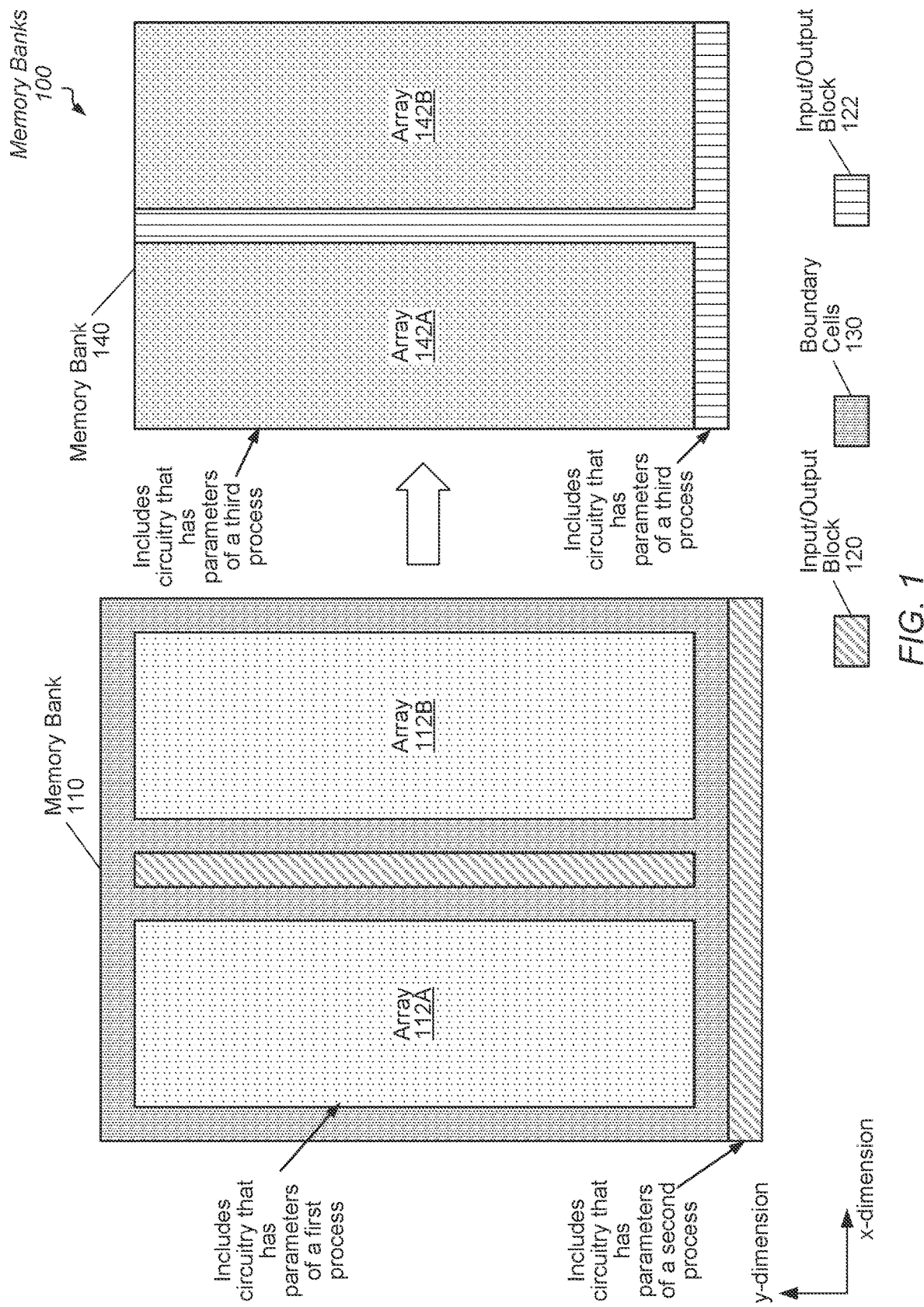
FIG. 1 is a generalized diagram of memory banks.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses and methods for designing memory macro blocks are contemplated. A memory array (or array) utilizes memory bit cells arranged as multiple rows and multiple columns. In various implementations, the memory array does not use boundary cells. Boundary cells do not include active devices (transistors), but boundary cells include multiple base layers and one or more metal layers that do not connect to a power supply. The placement of boundary cells improves semiconductor manufacturability and increase yield. External circuitry of the array, such as input/output (I/O) blocks used to perform read accesses and write accesses, are placed in a manner that they are abutting the array.

No placement of the boundary cells is used between the memory bit cells and the I/O blocks to improve semiconductor manufacturability and increase yield, since the circuitry of each of the memory bit cells and the I/O blocks has a same first subset of parameters of a particular semiconductor fabrication process (or process). The absence of the gaps and boundary cells between the memory bit cells and the I/O blocks still satisfies the design rule check (DRC) requirements. The first subset of parameters are process parameters of base layers such as the silicon substrate layer and layers between the silicon substrate and the metal zero layer. The metal zero layer is the bottom-most signal interconnect of the metal layers, or the closest signal interconnect metal layer to the silicon substrate. Differences in the first subset of parameters between two locations on the semiconductor die cause gaps and/or boundary cells to be placed between the two locations to improve semiconductor manufacturability and increase yield. Examples of the first subset of parameters include the carrier mobilities of n-type devices (transistors) and p-type devices, the gate oxide thicknesses of n-type devices and p-type devices, the doping concentration (or level) of the substrate or well of n-type devices and p-type devices, the doping concentration of source and drain regions of n-type devices and p-type devices, the widths and lengths of the source and drain regions of n-type devices and p-type devices, the type of metal material used to form metal gates, and the channel length under the metal gates, a height of fins of a Fin FET, a width of fins of a Fin FET, a Fin pitch of a Fin FET, a number of nanosheets of a gate all around (GAA) FET, a height of a GAA FET, a total cross-sectional area of the nanosheets of a GAA FET, a pattern of one or more p-type diffusion regions and one or more n-type diffusion regions used to define active regions, and a pitch of the one or more p-type diffusion regions and one or more n-type diffusion regions within a cell. As described earlier, an example of the two locations are a memory bit cell and an I/O block within a memory macro. By skipping the use of the boundary cells, the width and height of a memory bank that uses the array are reduced, and layout density increases.

There is a second subset of parameters that are semiconductor fabrication process parameters of the base layers different from the first subset of parameters. Differences in the second subset of parameters between two locations on the semiconductor die do not cause gaps and/or boundary cells to be placed between the two locations to improve semiconductor manufacturability and increase yield. Examples of the two locations are the memory bit cell and the I/O block. Examples of the second subset of parameters include the doping concentration (or level) of an ion implantation performed on silicon substrate at the gate region for a threshold voltage adjustment and the doping concentration (or level) of an ion implantation performed on the metal gate for a work function change that causes a threshold voltage adjustment.

The binary values of data stored in the memory bit cells are maintained by data storage loops within the memory bit cells. In addition, the binary values of the stored data are updated by write operations. In some implementations, the memory bit cells use n-type devices as write pass gates that allow updates of the stored values during the write operations. In various implementations, the memory bit cells use only p-type devices for the one or more read pass gates used in the memory bit cell. In some implementations, one or more the gate channel widths and lengths, the threshold voltages, the number of Fins (for FinFETs), and the number of nanosheets (for GAA devices) are set in a manner to form the n-type write pass gates as stronger compared to the pullup p-type devices of the data storage loops and the p-type device used as the read pass gate. A further description of both the circuits and the layout of the adjacent memory bit cells is provided in the below discussion.

Turning now to FIG. 1, a generalized block diagram of memory banks 100 is shown. In various implementations, a memory is organized as multiple memory banks. For example, a memory includes one or more memory banks. In an implementation, a memory includes both a left memory bank (or left bank) and a right memory bank (or right bank). In some implementations, each of the memory banks 110 and 140 is one of the left bank or the right bank of the memory macro block. Although "left" and "right" are used to describe the memory banks, other notations can be used such as a "top bank" and a "bottom bank," or "first bank" and "second bank." Any of these notations specify the memory banks positioned along the x-dimension. As shown, the memory bank 110 includes arrays 112A and 112B, input/output (I/O) blocks 120, and boundary cells 130. The memory bank 140 includes arrays 142A and 142B and input/output (I/O) blocks 122. The memory bank 140 does not include boundary cells 130.

In various implementations, each of the arrays 112A-112B includes multiple memory bit cells (not shown) arranged in a tiled format. The I/O blocks 120 arranged in a vertical direction along the y-dimension and in between the arrays 112A and 112B and arranged in a horizontal direction along the x-dimension and below the arrays 112A and 112B include multiple standard cells to provide a variety of types of functionalities. As used herein, a "standard cell" is a smallest building block of a standard cell library above cells of individual Boolean gates. Standard cells and individual Boolean gate cells are used to provide functionality of larger design blocks by having copies of the standard cells and Boolean gates instantiated within the larger design blocks followed by a routing step to provide interconnection.

In various implementations, the I/O blocks 120 include standard cells for performing read accesses of data stored in the arrays 112A and 112B as well as performing write accesses of data stored in the arrays 112A and 112B. In various implementations, the I/O blocks 120 include one or more of sense amplifiers, read operating timing logic and write operation timing control logic, read latches, read data multiplexers, read column select logic, row decoders for read operations, read word line drivers, write latches, write data mask logic, write word line drivers, and write data buffers. It is possible and contemplated that, in other implementations, the I/O blocks 120 include standard cells that provide the functionality of other types of logic not listed. It is also possible and contemplated that the I/O blocks 120 include one or more cells that do not use a same layout as other cells of the I/O blocks 120. Although the I/O blocks 120 appear uniform in the illustrated implementation, it is possible and contemplated that the I/O blocks 120 are further divided into sub-blocks based on layout of the cells and the functionality provided. Therefore, it is possible and contemplated that the I/O blocks 120 use additional boundary cells 130 placed between sub-blocks.

In addition to indicating the Boolean functionality and other functionality of the components used within the standard cell, the standard cells also include mask layout data. The mask layout data of a particular standard cell includes one or more mask layers associated with the one or more layers of the particular standard cell. The one or more layers of the particular standard cells include the base layers and the multiple metal layers used for signal interconnect. The mask layout data includes the mask patterns used in photolithography performed during semiconductor fabrication of integrated circuits. The mask patterns indicate the placement locations of components within the particular standard cell with respect to a reference point such as a certain corner of the particular standard cell. Examples of the components are active devices and passive elements (e.g., resistors, capacitors, inductors) placed in the standard cell. The mask layout data also includes the parasitic information of the components such as the resistance of wires and nodes, coupling capacitance of wires and transistor terminals, and load capacitance.

As described above, standard cells and individual Boolean gate cells are used to provide functionality of larger design blocks by having copies of the standard cells and Boolean gates instantiated within the larger design blocks followed by a routing step to provide interconnection. A copy of a particular larger design block that can be instantiated multiple times in the floorplan is referred to as a "macro block," or simply a "macro." Most macros include active devices for providing functionality. For example, the array 112A can be referred to as a memory macro, or a memory macro block, which includes multiple instantiations of a particular standard cell such as a particular memory bit cell.

In contrast to the standard cells and the macros, the boundary cells 130 do not include active devices, such as transistors. Rather, the boundary cells 130 include multiple base layers and one or more metal layers that do not connect to a power supply. The placement of boundary cells 130 improves semiconductor manufacturability and increase yield. Typically, the boundary cells 130 are placed in gaps in the floorplan of the die of an integrated circuit being designed. The gaps are between two macros that have differences of one or more of a first subset of parameters of a particular semiconductor fabrication process (or process). The absence of the gaps and boundary cells 130 between the two macros, such as the memory bit cells of the arrays 112A and 112B and the cells of the I/O blocks 120, causes errors regarding the design rule check (DRC) requirements. The first subset of parameters are process parameters of base layers such as layers between the silicon substrate and the metal zero layer, which is the bottom-most signal interconnect of the metal layers. Examples of the first subset of parameters include the carrier mobilities of n-type devices (transistors) and p-type devices, the gate oxide thicknesses of n-type devices and p-type devices, the doping concentration (or level) of the substrate or well of n-type devices and p-type devices, the doping concentration of source and drain regions of n-type devices and p-type devices, the widths and lengths of the source and drain regions of n-type devices and p-type devices, the type of metal material used to form metal gates, and the channel length under the metal gates, a height of fins of a Fin FET, a width of fins of a Fin FET, a Fin pitch of a Fin FET, a number of nanosheets of a gate all around (GAA) FET, a height of a GAA FET, a total cross-sectional area of the nanosheets of a GAA FET, use a pattern of one or more p-type diffusion regions and one or more n-type diffusion regions used to define active regions, and a pitch of the one or more p-type diffusion regions and one or more n-type diffusion regions within a cell.

As used herein, an "active region" is also referred to as an "active layer." The active region identifies an area above the silicon substrate where the insulating oxide layer (e.g., silicon dioxide) is etched, and an ion implantation fabrication step is performed to create an n-type region or a p-type region. When other fabrication steps are performed to create a metal gate over the active region, an active device (transistor) is formed such as a field effect transistor (FET). The FET can be one of a variety of planar transistors or non-planar transistors. There is a second subset of parameters that are semiconductor fabrication process parameters of the base layers different from the first subset of parameters. Differences in the second subset of parameters between two macros, such as the memory bit cells of the arrays 112A and 112B and the cells of the I/O blocks 120, does not cause gaps and/or boundary cells to be placed between the two macros to improve semiconductor manufacturability and increase yield. Examples of the second subset of parameters include the doping concentration (or level) of an ion implantation performed on silicon substrate at the gate region for a threshold voltage adjustment and the doping concentration (or level) of an ion implantation performed on the metal gate for a work function change that causes a threshold voltage adjustment.

As shown, the memory bit cells of the arrays 112A and 112B and the cells of the I/O blocks 120 have differences in one or more of the first subset of parameters. Therefore, the boundary cells 130 are placed in the memory bank 110 to avoid errors caused by DRC requirements, to improve semiconductor manufacturability, and to increase yield. It is also possible and contemplated, in some implementations, that cells within the I/O blocks 120 have differences in one or more of the first subset of parameters, and the boundary cells 130 are placed between these cells. In contrast, the memory bit cells of the arrays 142A and 142B and the cells of the I/O blocks 122 do not have differences in any of the first subset of parameters. In various implementations, a variety of functionality provided by the I/O blocks 122 is the same as the variety of functionality provided by the I/O blocks 120. Due to the memory bit cells of the arrays 142A and 142B and the cells of the I/O blocks 122 not having differences in any of the first subset of parameters, the boundary cells 130 are not placed in the memory bank 140 to avoid errors caused by DRC requirements, to improve semiconductor manufacturability, or to increase yield. It is possible that the memory bit cells of the arrays 142A and 142B and the cells of the I/O blocks 122 have differences in one or more of the second subset of parameters, and still the memory bank 140 does not use the boundary cells 130.

The memory bit cells from the standard cell library used in the arrays 112A and 112B use one or more values of the first subset of parameters different from values of the first subset of parameters used by the standard cells of the I/O blocks 120. Therefore, to improve semiconductor manufacturability and increase yield, the boundary cells 130 are placed between the array 112A and the I/O blocks 120 placed to the right of the array 112A along the x-dimension. Similarly, the boundary cells 130 are placed between the array 112A and the I/O blocks 120 placed below the array 112A along the y-dimension. The memory bank 110 includes a similar placement of boundary cells 130 around the array 112B.

The shapes used for the floorplan that includes the memory bank 110 have dimensions of the macro blocks and standard cells they represent. The dimensions of the shapes have limits in order to place all of the components on the same die. The limits are set by various factors such as placement of the macros and standard cells in addition to the placement of the boundary cells 130. If the minimum width in the x-dimension and/or minimum height in the y-dimension is not satisfied in the floorplan, then the necessary components do not fit on the same die. Designers have a choice of reducing the data storage capacity of the arrays 112A and 112B of the memory bank 110, which can reduce system performance. Designers can also maintain the data storage capacity of the arrays 112A and 112B of the memory bank 110, and perform significant redesign by moving or shifting of macro blocks in the floorplan. Such redesign consumes an appreciable amount of design time, which delays product releases. The placement of the boundary cells 130 in the memory bank 110 can cause one or more of the minimum width and minimum height of the floorplan to not be satisfied.

In contrast to the memory bank 110, the memory bank 140 does not use the boundary cells 130. The I/O blocks 122 are abutting each of the array 142A and 142B. No placement of the boundary cells 130 is used, since the memory bit cells used in the arrays 142A and 142B and the cells of the I/O blocks 122 use the same values for each of the first subset of parameters of the process. By skipping the use of the boundary cells 130, the memory bank 140 maintains the data storage capacity of the memory bank 110, but the memory bank 140 has a smaller width and a smaller height than the memory bank 110. Therefore, significant redesign can be avoided while maintaining the targeted data storage capacity by using the memory bank 140 in the floorplan of the integrated circuit being designed. It is also possible and contemplated that one or more other circuit blocks are placed in an abutting manner next to the memory bank 140 on one or more sides of the memory bank 140 with no boundary cells 130 used between the memory bank 140 and these one or more other circuit blocks. In such implementations, these one or more other circuit blocks use the same values for each of the first subset of parameters of the process.

In some implementations, the first subset of parameters of the process are parameters used by standard cells of a standard cell library. For example, each of the standard cells and individual Boolean gate cells in the standard cell library used to provide functionality of larger design blocks have layout that uses the first subset of parameters of the process. It is noted that some of the I/O blocks 120 of the memory bank 110 includes cells that have layout that uses the first subset of parameters, whereas, the memory bit cells of the arrays 112A and 112B as well as one or more other I/O blocks 120 do not include layout that uses the first subset of parameters of the process. Therefore, the memory bank 110 uses the boundary cells 130.

Figure 2:
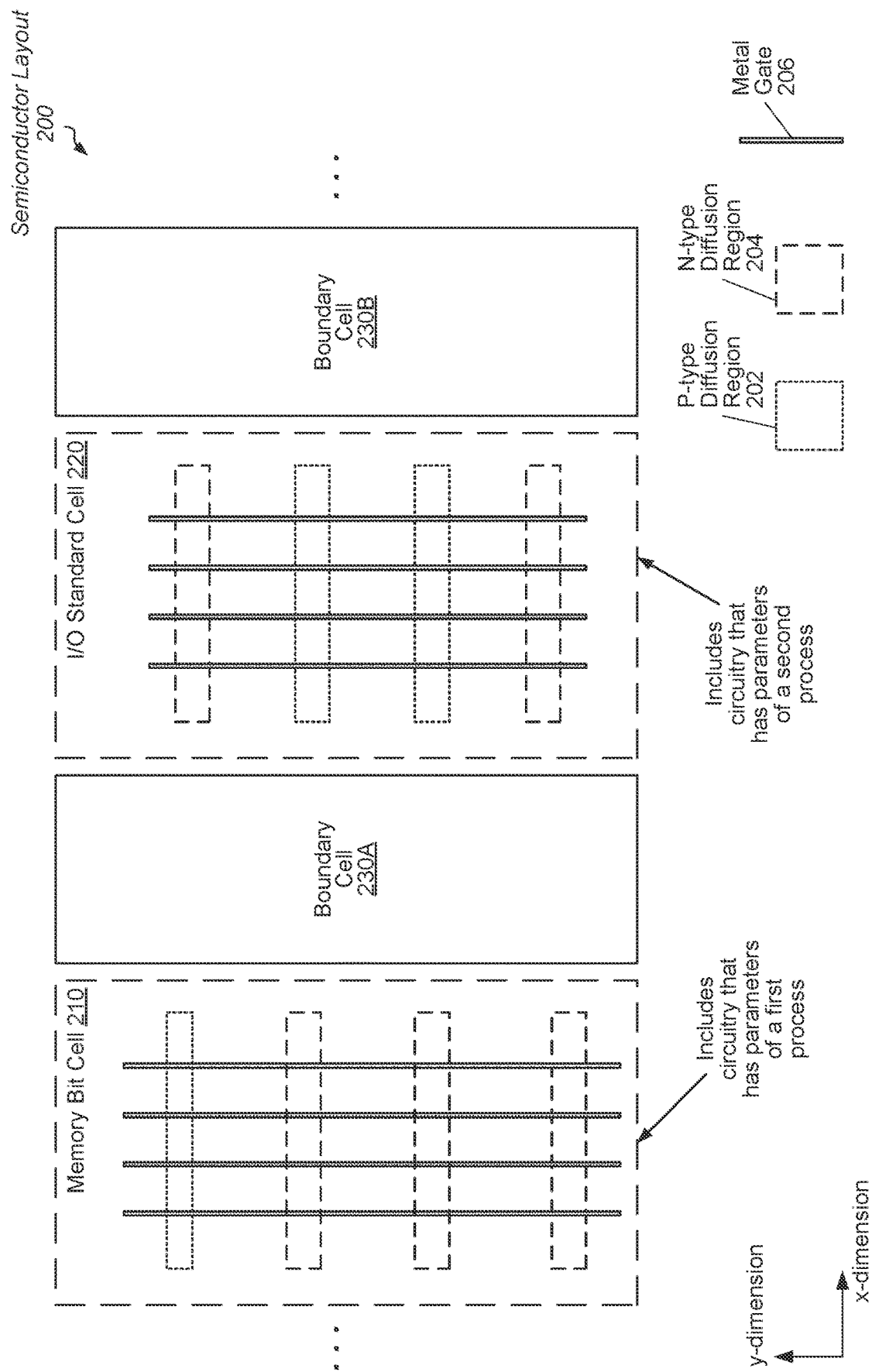
FIG. 2 is a generalized diagram of semiconductor layout of a memory bit cell.

Referring to FIG. 2, a generalized block diagram of semiconductor layout 200 is shown. In the illustrated implementation, the semiconductor layout 200 is for an edge of a memory macro that uses multiple instantiations of the memory bit cell 210. The boundary cell 230A is placed adjacent to the memory bit cell 210 at the edge of a memory array. Multiple memory bit cells (not shown) are placed to the left of the memory bit cell 210 along the x-dimension to create a row of the memory array. An I/O standard cell 220 is placed adjacent to the boundary cell 230A on the opposite side along the x-dimension. A boundary cell 230B is placed adjacent to the I/O standard cell 220. Multiple memory bit cells are placed adjacent to the boundary cell 230B on the opposite side along the x-dimension to create a row of another memory array. In various implementations, the standard cell layout 200 is used for an edge of a row of an array in the memory bank 110 (of FIG. 1).

As shown, the semiconductor layout 200 (or layout 200) uses metal gate 206 in a vertical direction along the y-dimension and diffusion regions 202 and 204 used to define active regions in a horizontal direction along the x-dimension. For example, p-type diffusion region 202 defines a p-type active region in the layout 200, whereas, the n-type diffusion region 204 defines an n-type active region in the layout 200. Therefore, p-type transistors (not shown) are formed in locations where the p-type diffusion region 202 are placed, n-type transistors are formed in locations where the n-type diffusion region 204 are placed. As used herein, a "transistor" is also referred to as a "device," and an "n-type transistor" is also referred to as an "n-type device," an "n-type MOSFET," and an "nfet." Additionally, a "p-type transistor" is also referred to as a "p-type device," a "p-type MOSFET," and a "pfet."

Similar to the transistors of memory banks 100 (of FIG. 1), in some implementations, the transistors in the layout 200 are planar metal oxide semiconductor (MOS) field effect transistors (FETs). In other implementations, the devices (or transistors) of the layout 200 are non-planar transistors such as Fin field effect transistors (FinFETs), and gate all around transistors (GAA FETs). In some implementations, the source/drain regions are implemented with trench silicide contacts. Trench silicide contacts used for source/drain regions, signal routes in different metal layers, contacts and vias, and so forth are not shown in layout 200 for ease of illustration.

Similar to the boundary cells 130 (of FIG. 1), each of the boundary cells 230A and 230B includes one or more fabrication structures such as one or more base layers and one or more metal layers. The base layers include the silicon substrate layer and layers between the silicon substrate and the metal zero layer. The metal zero layer is the bottom-most signal interconnect of the metal layers, or the closest signal interconnect metal layer to the silicon substrate. The metal layers of the boundary cells 230A and 230B include a particular pattern of a metal layer of one or more of the metal layers. In some implementations, the boundary cells 230A and 230B include a pattern in each of the available signal metal layers. The patterns of metal layers in the boundary cells 230A and 230B fill empty areas of the floorplan to provide regular planarization of the resulting fabricated wafer.

In some implementations, the standard cell library includes multiple variations of the boundary cells 230A and 230B with each variation having one or more of a different number of one or more layers than another variation, a different pattern of diffusion regions 202 and 204 than another variation, a different width or height than another variation, and so on. For example, the number of dummy metal gates can vary between the different standard cells and different macros, since the particular number depends on the location in the floorplan where the boundary cell is being instantiated. In some implementations, one or more of the boundary cells in the standard cell library include tap cells that are used to connect an n-type well to a power supply voltage and connect the silicon substrate to a ground reference voltage. In an implementation, one or more of the boundary cells in the standard cell library include endcap cells that improve well and row alignment, and aid the later semiconductor fabrication process in using the correct laser wavelength.

The boundary cells in the standard cell library provide an even distribution of metal layers across the die by including shapes in the metal layers in open regions. These shapes are not used to transport signals. The even distribution provides uniformity that aids the semiconductor fabrication process. For example, the addition of one or more metal layers that do not transport signals in the boundary cells reduce thickness variations during a chemical-mechanical polishing (CMP) fabrication step, and improve electrochemical deposition (ECD), etching, and lithography steps as well as reduce stress effects across the die. In some implementations, the boundary cells in the standard cell library includes one or more standard cells that are referred to as "fill cells" or "filler cells." These standard cells, or filler cells, in the library, are used to provide both front end of line (FEOL) fill and back end of line (BEOL) fill.

In the illustrated implementation, each of the memory bit cell 210 and the I/O standard cell 220 provides a number of contacted gate (poly) pitches (CPP) of four. For example, each of the memory bit cell 210 and the I/O standard cell 220 uses four metal gates 206. The metric of CPP is one metric used to characterize a density of semiconductor layout. The acronym CPP is used, since metal gates can be formed using polysilicon, so there would be a number of contacted polysilicon (poly) pitches, or CPP, in the layout 200. However, metal gates can now also be formed from a variety of other materials. Titanium nitride (TiN) is one example of material used to form metal gates 206 in layout 200. Although other materials can be used to form the metal gates 206 of layout 200, the acronym CPP is still used. In other implementations, the memory bit cell 210 and the I/O standard cell 220 provide a different CPP than four.

The memory bit cell 210 uses a first pattern of one or more p-type diffusion regions 202 and one or more n-type diffusion regions 204 used to define active regions (or first pattern). For example, from top to bottom of the memory bit cell 210 along the y-dimension, the first pattern includes a p-type diffusion region 202 followed by three n-type diffusion regions 204. The I/O standard cell 220 uses a second pattern of one or more p-type diffusion regions 202 and one or more n-type diffusion regions 204 used to define active regions (or second pattern). For example, from top to bottom of the I/O standard cell 220 along the y-dimension, the second pattern includes an n-type diffusion region 204 followed by two p-type diffusion regions 202 followed by an n-type diffusion region 204. The second pattern is different from the first pattern. Between the first pattern and the second pattern, the order of the diffusion regions 202 and 204 is different, the distance from the top of the cell to the top-most diffusion region along the y-dimension is different, the distance from the bottom-most diffusion region to the bottom of the cell along the y-dimension is different, and one or more widths of the diffusion regions are different. In some implementations, the pitch of the diffusion regions 202 and 204 are also different. The differences between the first pattern and the second pattern provide differences of values of the first subset of parameters of the semiconductor fabrication process between the memory bit cell 210 and the I/O standard cell 220.

As described earlier, to improve semiconductor manufacturability and increase yield when there are differences of values of the first subset of parameters of the semiconductor fabrication process, the boundary cells 230A are placed between the memory bit cell 210 and the I/O standard cell 220 along the x-dimension. Similarly, the boundary cell 230B is placed adjacent to the I/O standard cell 220. In a similar manner, boundary cells are placed below a bottom-most row of the memory array that uses the memory bit cell 210. Such boundary cells separate the memory bit cell 210 from other I/O standard cells that use the same second pattern used by the I/O standard cell 220. The placement of the boundary cells 230A and 230B causes the dimensions of circuitry that uses the layout 200 to grow. In one implementation, a memory bank uses the layout 200, and the memory bank can cause floor planning issues due to the extended width and height used to accommodate the placement of boundary cells such as boundary cells 230A and 230B. An example of layout that does not use boundary cells is described in the following description.

Figure 3:
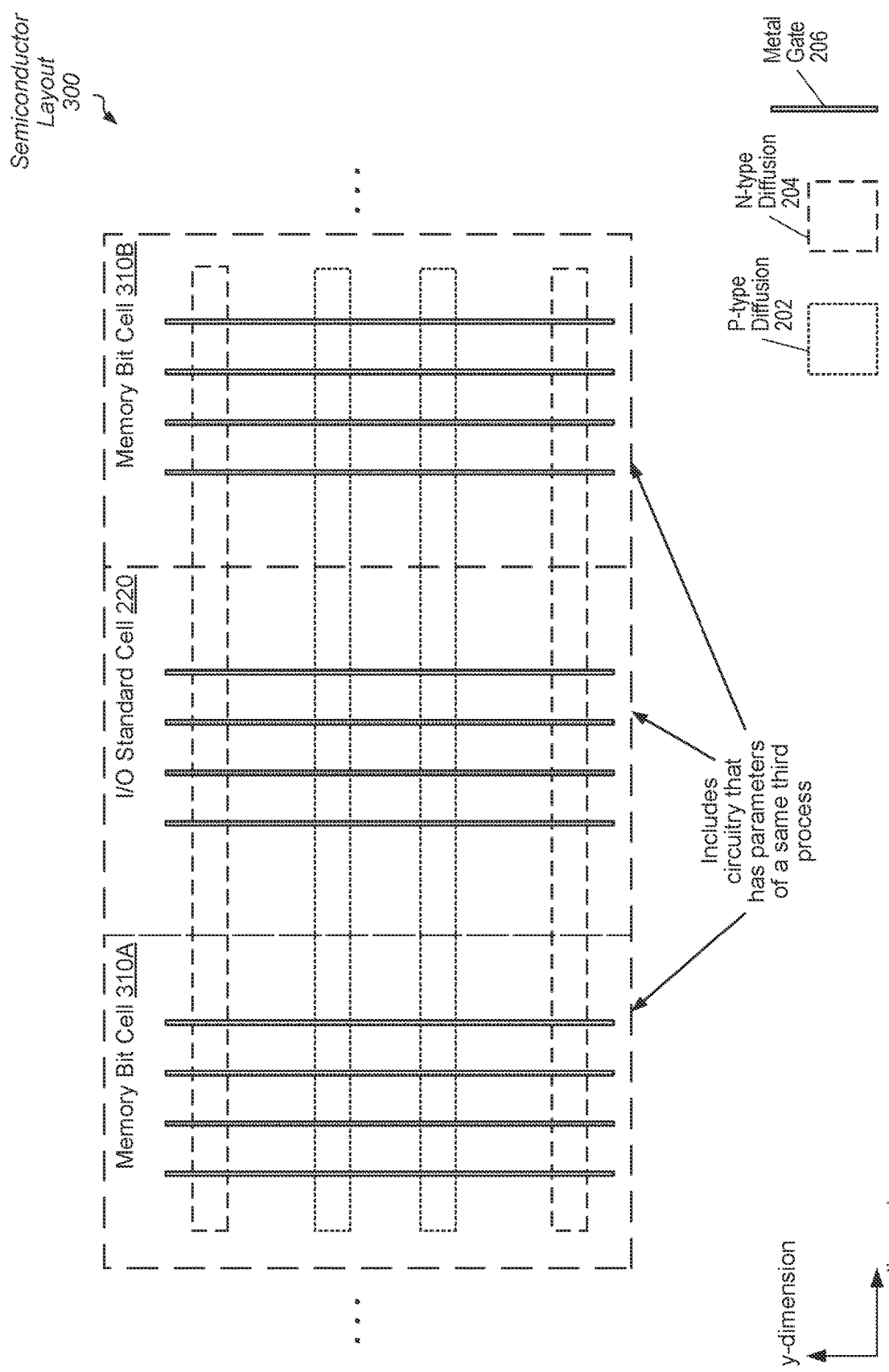
FIG. 3 is a generalized diagram of semiconductor layout of a memory bit cell.

Turning now to FIG. 3, a generalized block diagram of one implementation of semiconductor layout 300 is shown. Signals, circuitry, and semiconductor layout components described earlier are numbered identically. In the illustrated implementation, the memory bit cell 310A and the I/O standard cell 220 are placed in an adjacent manner with no boundary cells between them. The memory bit cell 310A is used in a memory bank placed on the left along the x-dimension. Similarly, the memory bit cell 310B and the I/O standard cell 220 are placed in an adjacent manner with no boundary cells between them. The memory bit cell 310B is used in a memory bank placed on the right along the x-dimension.

In contrast to the semiconductor layout 200, the semiconductor layout 300 (or layout 300) does not use the boundary cells. The layout 300 does not use boundary cells, since the memory bit cells 310A and 310B use the same values for each of the first subset of parameters of the process that was described earlier. For example, from top to bottom of the memory bit cells 310A and 310B along the y-dimension, the first subset of parameters includes at least an n-type diffusion region 204 followed by two p-type diffusion regions 202 followed by an n-type diffusion region 204.

Each of the memory bit cell 310A and the I/O standard cell 220 uses the same distance from the top of the cell to the top-most diffusion region along the y-dimension, uses the same distance from the bottom-most diffusion region to the bottom of the cell along the y-dimension, uses the same widths of the diffusion regions 202 and 204, and uses the same pitch of the diffusion regions 202 and 204. These patterns are repeatable patterns when memory bit cells are placed adjacent to one another, and when standard cells of the I/O blocks are placed adjacent to one another. When each of the other values of the first subset of parameters of the process is the same for the memory bit cell 310A and the I/O standard cell 220, the layout 300 does not include boundary cells. By skipping the use of the boundary cells, the layout 300 can be used by a memory bank to have a smaller width and a smaller height than a memory bank that uses the layout 200 (of FIG. 2). Therefore, significant redesign can be avoided by using the layout 300 in the floorplan of the integrated circuit being designed.

As described earlier, there is a second subset of parameters that are semiconductor fabrication process parameters of the base layers different from the first subset of parameters. Differences in the second subset of parameters between the memory bit cell 310A and the I/O standard cell 220 does not cause gaps and/or boundary cells to be placed between them to improve semiconductor manufacturability and increase yield. Examples of the second subset of parameters include the doping concentration (or level) of an ion implantation performed on silicon substrate at the gate region for a threshold voltage adjustment and the doping concentration (or level) of an ion implantation performed on the metal gate for a work function change that causes a threshold voltage adjustment.

Figure 4:
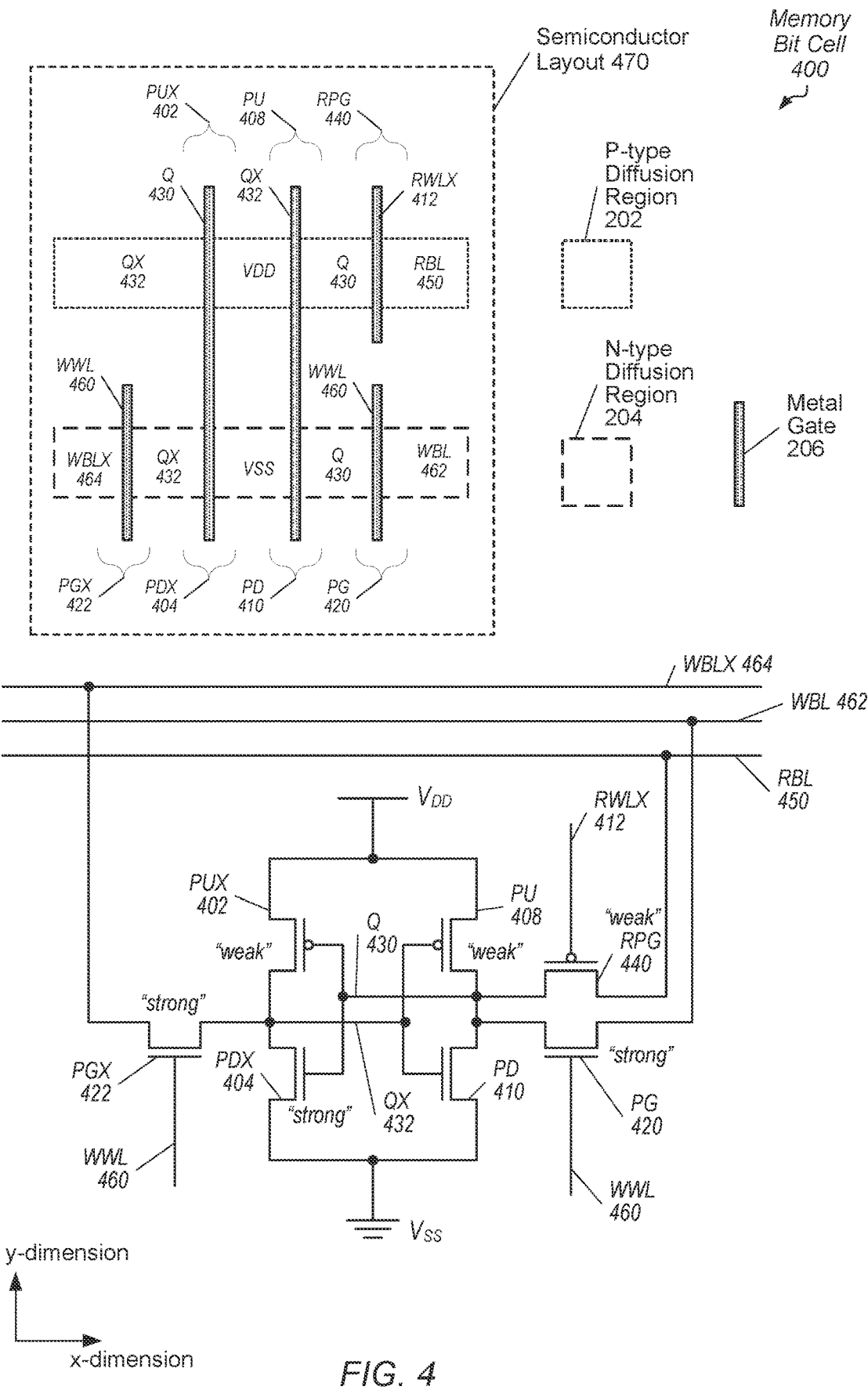
FIG. 4 is a generalized diagram of a memory bit cell.

Turning to FIG. 4, a generalized block diagram of one implementation of a memory bit cell 400 is shown. A diagram of semiconductor layout 470 of the memory bit cell is provided. Additionally, a circuit diagram of the memory bit cell using transistors (devices) PUX 402, PDX 404, PU 408, PD 410, PG 420, PGX 422 and RPG 440 is provided. The labels used in FIG. 4, such as "PUX 402" and "Q 430" help to identify transistors and circuit nodes in the circuit diagram of FIG. 4 and equivalent transistors and nodes in the semiconductor layout 470. In addition, the power supply reference level is indicated by "VDD" and the ground reference voltage level is indicated by "VSS."

The source/drain regions of the layout 470 are electrically equivalent to signals named in a similar manner and used in the circuit diagram of FIG. 4. Similarly, the metal gates of the layout 470 are electrically equivalent to signals named in a similar manner and used in the circuit diagram. The signals are physically disconnected at the source/drain regions and at the metal gates until further layers and contacts (not shown) are placed to electrically connect nodes to one another. For example, the data storage node Q 430 on the p-type diffusion region 202 and the data storage node Q 430 on the n-type diffusion region 204 are logically equivalent, but the p-type active region forming the source/drain region for node Q 430 does not physically abut with the n-type active region forming the source/drain region for node Q 430. Therefore, these nodes are not physically connected at the source/drain regions. When the semiconductor fabrication steps place the further metal layers, vias and contacts, which are not shown for ease of illustration, these nodes become physically connected. This physical connection allows these nodes to become electrically connected when voltage levels are applied to the layout 470.

In the implementation shown, data storage by a latching element is provided by the memory bit cell 400. For example, the p-type devices PUX 402 and PU 408, and the n-type devices PDX 404 and PD 410, provide data storage using a back-to-back configuration of inverters. The p-type device RPG 440 provides a read access circuit for the memory bit cell 400 such that memory bit cell 400 is a single read port bit cell. The n-type devices PG 420 and PGX 422 provide write access circuits for the memory bit cell 400. In various implementations, the devices of memory bit cell 400 are one of a variety of planar transistors and non-planar transistors.

The memory bit cell 400 is one implementation of a static random access memory RAM (SRAM). In other implementations, another one of various types of RAM cells is used. This "memory bit cell" can also be referred to as the "SRAM bit cell." In various implementations, the memory bit cell 400 is copied many times and arranged in an array of rows and columns for a memory. The array includes external circuitry (not shown) such as one or more of row decoders, column decoders, a sense amplifier, pre-charge circuitry, and sequential elements such as latches or flip-flop circuits for storing read access data and write access data. Examples of the array are array 142A and 142B (of FIG. 1). Examples of I/O blocks that include the external circuitry are the I/O blocks 120 (of FIG. 1).

As used herein, a Boolean logic high level is also referred to as a logic high level. Similarly, a Boolean logic low level is also referred to as a logic low level. In various implementations, the logic high level is equal to a power supply reference level and the logic low level is equal to a ground reference level. As used herein, a circuit node or line is "asserted" when the node or line stores a voltage level that enables a transistor that receives the voltage level. As used herein, the circuit node or line is "negated" when the node or line stores a voltage level that disables a transistor that receives the voltage level. The devices PUX 402, PDX 404, PU 408 and PD 410 are enabled or disabled based on the logic levels of the data storage nodes Q 430 and QX 432.

When a write operation is occurring, a row decoder (not shown) receives address information and enables a single row word line of multiple row word lines. In implementations utilizing memory banks, the row decoder (not shown) receives the address information and enables a particular word line of a targeted memory bank, which contains multiple row word lines. When the memory bit cell 400 is in the row corresponding to the enabled row word line, the WWL 460 of memory bit cell 400 is asserted by external access circuitry. Accordingly, each of the n-type devices PG 420 and PGX 422 is enabled. The enabled transistors PG 420 and PGX 422 respectively connect the word line WBL 462 to the node Q 430 and the WBLX 464 to the node QX 432 of the memory bit cell 400. The write word line WWL 460 is also connected to other memory bit cells in a corresponding row of the array. It is noted for memory bit cells not targeted by the write operation, the data storage remains unchanged.

For read access operations, in some implementations, external pre-charge transistors are disabled, the read word line is asserted, an external sense amplifier is enabled, and the external read latches are enabled to capture the data read from the targeted memory bit cells. The data stored by the latch element (devices PUX 402, PDX 404, PU 408 and PD 410) of the memory bit cell 400 is gated from the read bit line RBL 450 by the p-type device RPG 440. The p-type device RPG 440 receives the data on the node Q 430 and the data on the read word line RWLX 412. The output of the p-type device RPG 440 is the read bit line RBL 450. The bit line RBL 450 is pre-charged to a logic low level such as the ground reference level "VSS." After the pre-charge cycle (or phase) has ended, when the word line RBL 450 is asserted, the p-type device RPG 440 becomes enabled. When the p-type device RPG 440 is enabled and the node Q 430 stores a logic low level, the p-type device RPG 440 charges the bit line RBL 450 to a logic high level.

The semiconductor layout 470 (or layout 470) uses a pattern of p-type diffusion region 202 and n-type diffusion region 204 used to define active regions that matches a pattern used by Boolean logic standard cells of the standard cell library. In other words, the layout 470 uses a pattern that matches the pattern of external circuitry of the array, and the p-type diffusion region 202 of the layout 470 and the external circuitry of the array are aligned with one another and the n-type diffusion region 204 of the layout 470 and the external circuitry of the array are also aligned with one another. These patterns are repeatable patterns when memory bit cells are placed adjacent to one another, and when standard cells of the I/O blocks are placed adjacent to one another.

In some implementations, the layout 470 can have mirrored versions of itself instantiated and placed adjacent to it such as placed above and below it along the y-dimension. In such implementations, the layout of the corresponding memory bit cells uses the third pattern of one or more p-type diffusion regions 202 and one or more n-type diffusion regions 204 used to define active regions that was described earlier with reference to the memory bit cells 310A and 310B. As described earlier, this third pattern matches the second pattern of the I/O standard cell 220 that was described earlier. When the patterns match between the memory bit cells and the standard cells of the external circuitry of the array, such as the I/O standard cells of an I/O block, the resulting layout does not use boundary cells. Rather, the memory bit cells and the standard cells are placed adjacent to one another on the die of the integrated circuit being designed. This adjacent placement of the cells increases density of the memory macro.

To create the layout 470 of the memory bit cell 400 that uses the third pattern that matches the pattern of I/O standard cells, the memory bit cell 400 uses the p-type device RPG 440 for the read access circuit. In the circuit topology and layout of the I/O standard cells, there is an equal number of p-type devices and n-type devices. In contrast, the data storage circuit and the write access circuit of the memory bit cell 400 uses four n-type devices (e.g., PDX 404, PD 410, PG 420 and PGX 422), and two p-type devices (e.g., PUX 402 and PU 408). However, the use of the p-type device RPG 440 for the read access circuit avoids expansion of the memory bit cell 400 beyond what would be used for additional n-type devices. Despite using a number of p-type devices less than a number of n-type devices, the layout 470 uses the third pattern that is also used by I/O standard cells. As shown, the p-type devices PUX 402, PU 408, and RPG 440 are placed in a particular order. Similarly, the n-type devices PDX 404, PD 410, PG 420 and PGX 422 are placed in a particular order. The layout 470 provides a CPP of four, which matches the CPP of the I/O standard cells. For example, each of the layout 470 and the I/O standard cells uses four metal gates 206. The metric of CPP is one metric used to characterize a density of semiconductor layout.

In some implementations, the threshold voltages of the p-type devices PUX 402, PU 408 and 412 of the memory bit cell 400 are adjusted to be relatively weaker compared to the threshold voltages of the n-type devices of the memory bit cell 400. In other words, the threshold voltage of the p-type devices is greater than the threshold voltage of the n-type devices such that a p-type devices takes longer to become enabled and conduct current between the respective source region and drain region. Using devices with different threshold voltages in the memory bit cell 400 is made possible with the p-type device RPG 440 used as the read access circuit (or read port). The read pass gate (p-type device RPG 440) and the write pass gates (n-type devices PG 420 and PGX 422) have different threshold voltages.

In some implementations, forming the p-type devices PUX 402, PU 408 and 412 to be weaker than the n-type devices of the memory bit cell 400 is also accomplished by increasing the length of the gate channel of the p-type devices. When the p-type devices PUX 402 and PU 408 are formed to be relatively weak devices, the write operation improves for the memory bit cell 400. When the p-type devices PUX 402 and RPG 440 are formed to be relatively weak devices, the read operation improves for the memory bit cell 400. In addition, in various implementations, the read pass gate (p-type device RPG 440) is formed to be weaker device compared to the p-type device PU 408 such that a voltage drop on the node Q 430 does not become excessive.

In an implementation, the width of the active region at the gate terminal for the write pass gates (n-type devices PG 420 and PGX 422) is wider than the corresponding width of the p-type devices PUX 402, PU 408 and 412 of the memory bit cell 400. In another implementation, when the devices are FinFETs, the write pass gates (n-type devices PG 420 and PGX 422) have a greater number of Fins than the p-type devices PUX 402, PU 408 and 412. In yet another implementation, when the devices are GAA devices, the write pass gates (n-type devices PG 420 and PGX 422) have a greater number of nanosheets than the p-type devices PUX 402, PU 408 and 412. In each of these implementations, the write pass gates (n-type devices PG 420 and PGX 422) are formed to be stronger and conduct more drain current than the pullup data storage devices (p-type devices PUX 402 and PU 408), which improves the write operation for the memory bit cell 400.

In some implementations, one or more of the above techniques are also used on the n-type device PDX 404, which is the n-type pulldown device used to generate a voltage level on the node QX 432. Forming the n-type device PDX 404 to be stronger and conduct more drain current than the p-type devices of the memory bit cell 400 reduces node disturbances during the read operation. It is noted that unlike the traditional 6-transistor (6-T) SRAM cell, the forming of relatively weak devices in the memory bit cell 400 is possible due to no n-type devices are used for the read operation. Thus, there are no n-type devices in the read access circuit that could cause read disturb issues. The n-type devices of the memory bit cell 400 have an easier time overwriting a node despite electrically fighting p-type devices than n-type devices of the traditional 6T SRAM cell. Additionally, during the read operation, the memory bit cell 400 is able to lower the voltage switch point of the inverter that includes the devices PUX 402 and PDX 404, which reduces the likelihood of read disturb issues. The memory bit cell 400 can achieve both write operation stability and read operation stability without any form of active write assist such as a write word line boost technique.

Figure 5:
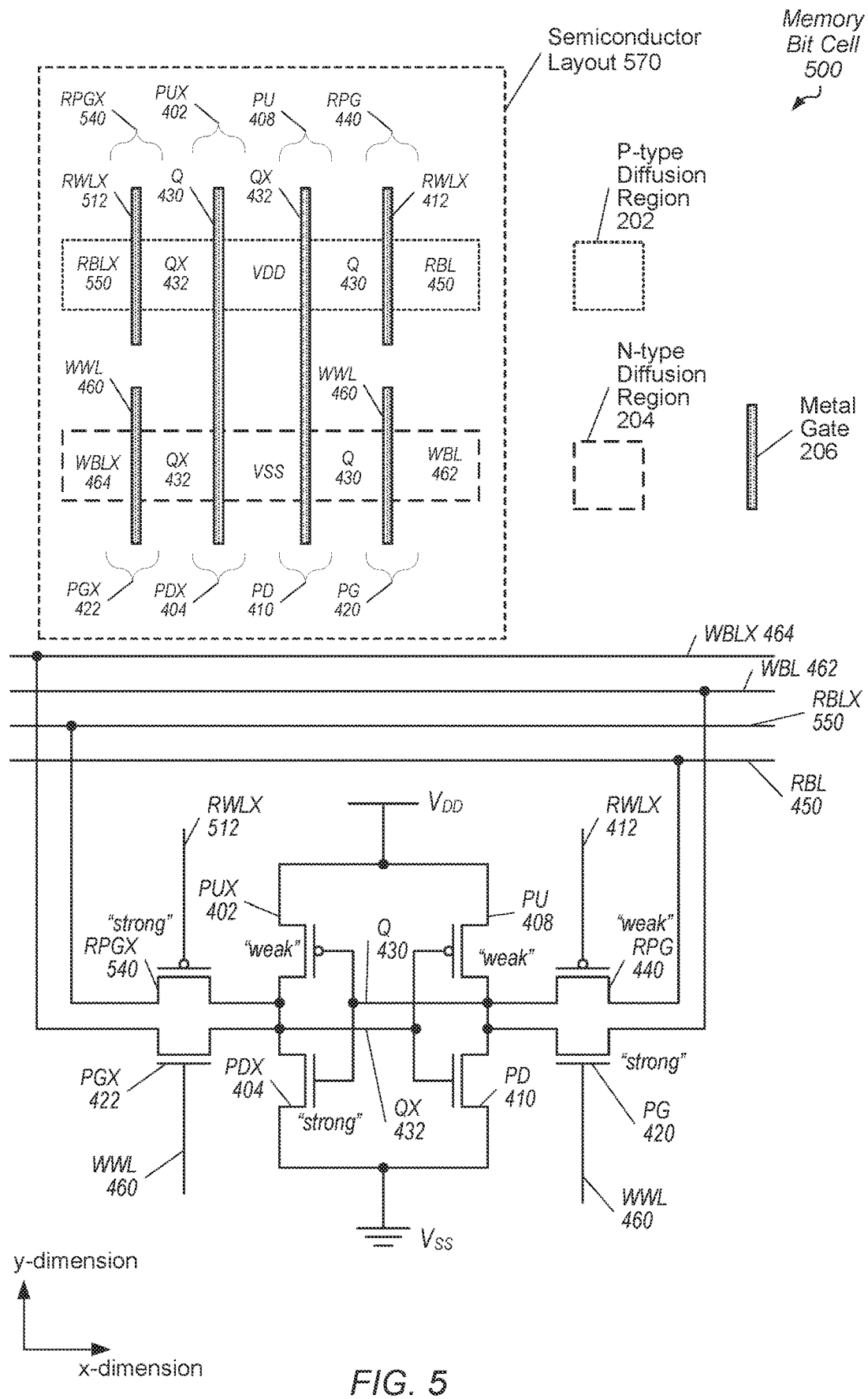
FIG. 5 is a generalized diagram of a memory bit cell.

Referring to FIG. 5, a generalized block diagram of one implementation of a memory bit cell 500 is shown. Signals, circuitry, and semiconductor layout components described earlier are numbered identically. The memory bit cell 500 includes the configuration of the previous memory bit cell 400, but an additional read port is provided with the additional p-type device RPG 540. The data stored by the latch element (devices PUX 402, PDX 404, PU 408 and PD 410) of the memory bit cell 500 is gated from the read bit line RBLX 550 by the p-type device RPGX 540. The p-type device RPGX 540 receives the data on the node QX 432 and the data on the read word line RWLX 512. The output of the p-type device RPGX 540 is the read bit line RBLX 550. Similar to the RBL 450, the bit line RBLX 550 is precharged to a logic low level such as the ground reference level "VSS."

The semiconductor layout 570 (or layout 570) of the memory bit cell 500 maintains a CPP of four similar to the layout 470 (of FIG. 4). Each of the layout 470 and the layout 470 uses the third pattern of one or more p-type diffusion regions 202 and one or more n-type diffusion regions 204 used to define active regions that was described earlier with reference to the memory bit cells 310A and 310B. As described earlier, this third pattern matches the second pattern of the I/O standard cell 220 that was described earlier.

In another implementation, a static read circuit is used, rather than a dynamic read circuit that uses a precharged bit line. In such an implementation, the memory bit cell uses a circuit similar to the memory bit cell 500 with two read pass gates using p-type devices such as RPG 440 and RPG 540. The layout of such an implementation is similar to the layout 570. The static read circuit (not shown) performs a differential read operation. A relatively small sized external amplifier using n-type devices can be used to restore a logic low level for each pair of read bit lines RBL 450 and RBLX 550. The differential read operation can cause read disturb issue on the bit-cell where the p-type device RPG 440 is weaker compared to the p-type device PU 408, and the p-type device RPGX 540 is weaker compared to the p-type device PUX 402. The series chain of n-type devices in the n-type sense amplifier improves the latency of the read operation, since this sense amplifier electrically fights less when the read operation is providing a logic high level.

Figure 6:
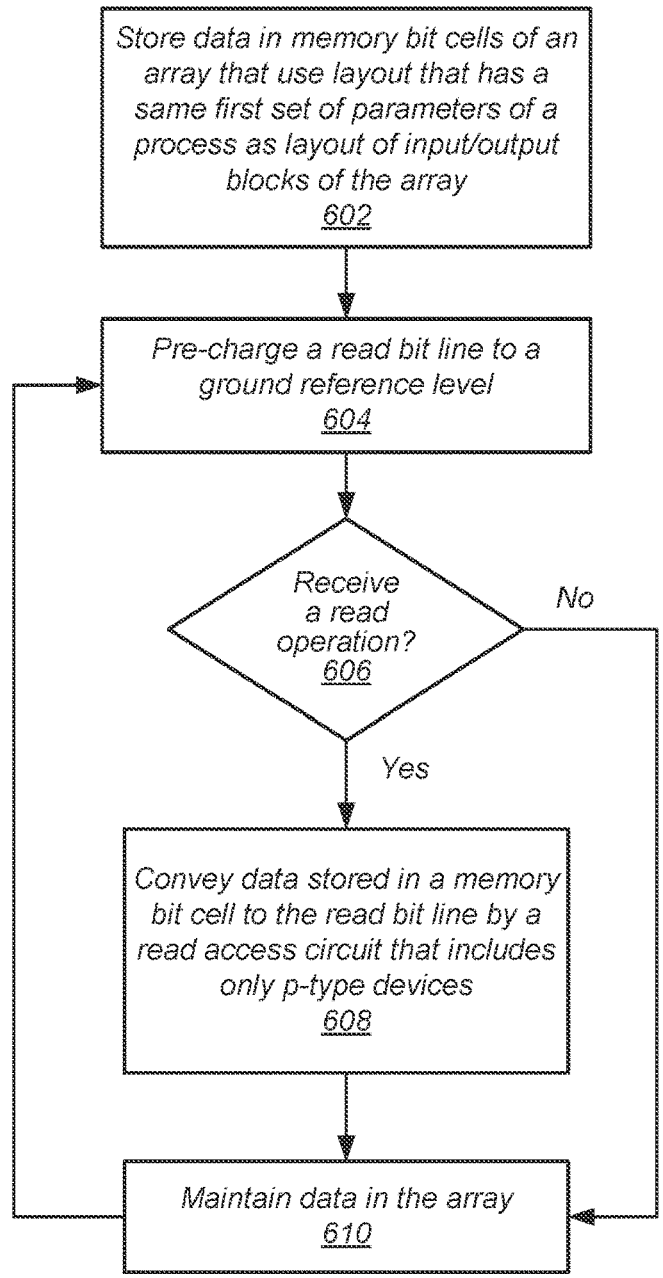
FIG. 6 is a generalized diagram of a method for efficiently designing memory macro blocks.

Referring now to FIG. 6, one implementation of a method 600 for efficiently designing memory macro blocks is shown. For purposes of discussion, the steps in this implementation (as well as in FIGS. 7 and 12) are shown in sequential order. However, in other implementations some steps occur in a different order than shown, some steps are performed concurrently, some steps are combined with other steps, and some steps are absent.

An array of memory bit cells arranged as multiple rows and columns stores data (block 602). In various implementations, the memory array does not use boundary cells. Rather, external circuitry of the array, such as I/O blocks used to perform read accesses and write accesses, are placed in a manner that they are abutting the array. No placement of the boundary cells is used, since the layout of the memory bit cells has a same first subset of parameters of base layers of a semiconductor fabrication process as the layout of the I/O blocks of the array. The absence of the gaps and boundary cells between the memory bit cells and the I/O blocks still satisfies the design rule check (DRC) requirements. Examples of the first subset of parameters was provided earlier in the description of the memory banks 100 (of FIG. 1). By skipping the use of the boundary cells, the width and height of a memory bank that uses the array are reduced, and layout density increases.

It is noted that there is a second subset of parameters that are semiconductor fabrication process parameters of the base layers different from the first subset of parameters. Differences in the second subset of parameters between the memory bit cells and the I/O blocks do not cause gaps and/or boundary cells to be placed between the memory bit cells and the I/O blocks to improve semiconductor manufacturability and increase yield. Examples of the second subset of parameters was provided earlier in the description of the memory banks 100 (of FIG. 1).

The values of the stored data are maintained by data storage loops within the memory bit cells. In addition, the values of the stored data are updated by write operations. In some implementations, the memory bit cells include feedback inverters to implement data storage loops, and the memory bit cells use n-type devices as write pass gates that allow updates of the stored values during the write operations. In some implementations, one or more the gate channel widths and lengths, the threshold voltages, the number of Fins (for FinFETs), and the number of nanosheets (for GAA devices) are set in a manner to form the n-type write pass gates as stronger compared to the pullup p-type devices of the data storage loops and the p-type device used as the read pass gate. In various implementations, the memory bit cells use only p-type devices for the one or more read pass gates used in the memory bit cell. In an implementation, the memory bit cells use the circuitry of the memory bit cell 400 (of FIG. 4) and the layout 470 (of FIG. 4).

Circuitry external to the memory bit cells pre-charges the read bit line to a ground reference level (block 604). Although a single read bit line is being described, in other implementations, the number of read ports and read bit lines is selected based on design requirements. If the array receives a read operation ("yes" branch of the conditional block 606), then a read access circuit, which includes only p-type transistors, conveys data stored in a bit cell in the targeted row to the read bit line (block 608). If the array does not receive a read operation ("no" branch of the conditional block 606), then control flow of method 600 skips block 608 and moves to the block 610. The memory bit cells maintain stored binary values (block 610). As described earlier, the memory bit cells include a latch element (data storage loop) for storing the binary values until the binary values are modified by a write operation. Control flow of method 600 returns to block 604 where circuitry external to the memory bit cells pre-charges the read bit line to a ground reference level such as in a next clock cycle.

Figure 7:
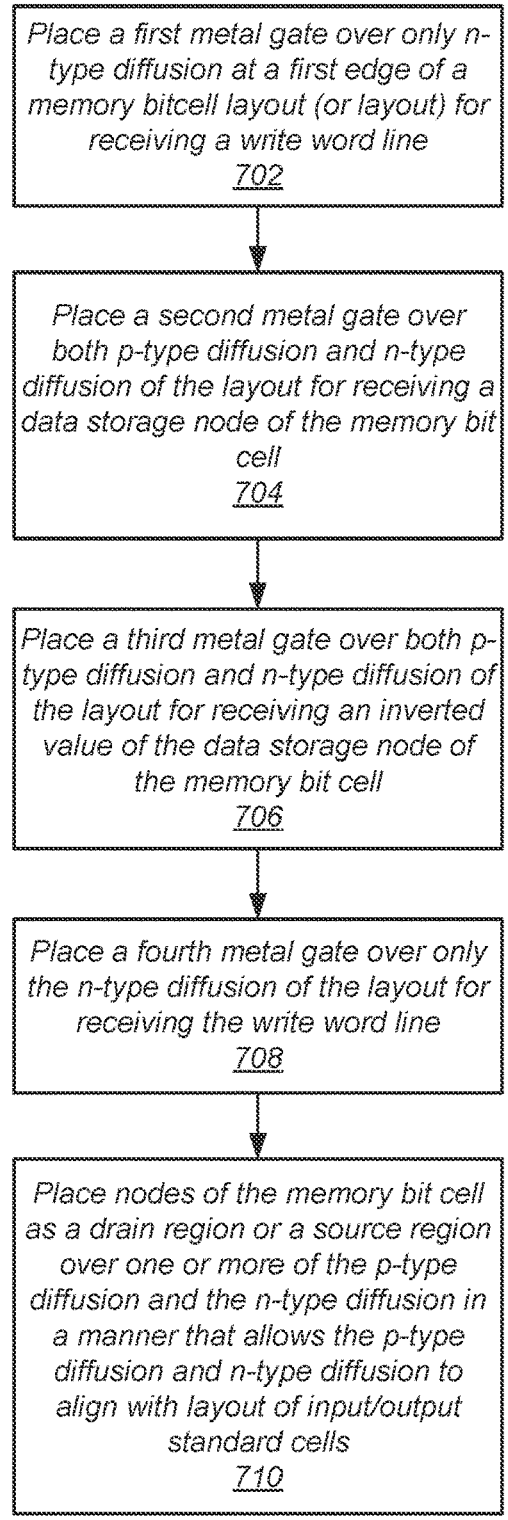
FIG. 7 is a generalized diagram of a method for efficiently creating semiconductor layout of a memory bit cell.

Referring now to FIG. 7, one implementation of a method 700 for efficiently creating semiconductor layout of a memory bit cell is shown. In the following description, multiple semiconductor fabrication steps are described. The steps correspond to a mask layout editor tool performing steps that are used to generate data that indicates the placement of particular semiconductor components such as a variety of base layers. The steps also correspond to a semiconductor fabrication process that produces a silicon die for testing and production use. In a first step, a first metal gate is placed over only p-type diffusion at a first edge of a memory bit cell layout for receiving a write word line (block 702). Therefore, the first metal gate is placed over a p-type active region used for creating p-type devices.

A second metal gate is placed over gate over both p-type diffusion and n-type diffusion of the layout for receiving a data storage node of the memory bit cell (block 704). The second metal gate is placed over both a p-type active region used for creating p-type devices and an n-type active region used for creating n-type devices. A third metal gate is placed over both p-type diffusion and n-type diffusion of the layout for receiving an inverted value of the data storage node of the memory bit cell (block 706). A fourth metal gate is placed over only n-type diffusion at a second edge of the layout for receiving the write word line (block 708).

Next, the process places nodes of the memory bit cell as a drain region or a source region over one or more of the p-type diffusion and the n-type diffusion in a manner that allows the p-type diffusion and n-type diffusion to align with layout of input/output standard cells (block 710). Examples of such node placement in layout are the layout 300 (of FIG. 3), the layout 470 (of FIG. 4) and the layout 570 (of FIG. 5). Multiple instantiations of the memory bit cell can be placed adjacent to one another in a mirrored format and can be placed adjacent to I/O blocks used for controlling read access and write accesses. The layout with the multiple instantiations of the memory bit cell does not use boundary cells, since the layout of the memory bit cells has a same first subset of parameters of base layers of a semiconductor fabrication process as the layout of the I/O blocks of the array. The absence of the gaps and boundary cells between the memory bit cells and the I/O blocks still satisfies the design rule check (DRC) requirements. Examples of the first subset of parameters was provided earlier in the description of the memory banks 100 (of FIG. 1). The lack of boundary cells allows the layout to achieve higher density.

Figure 8:
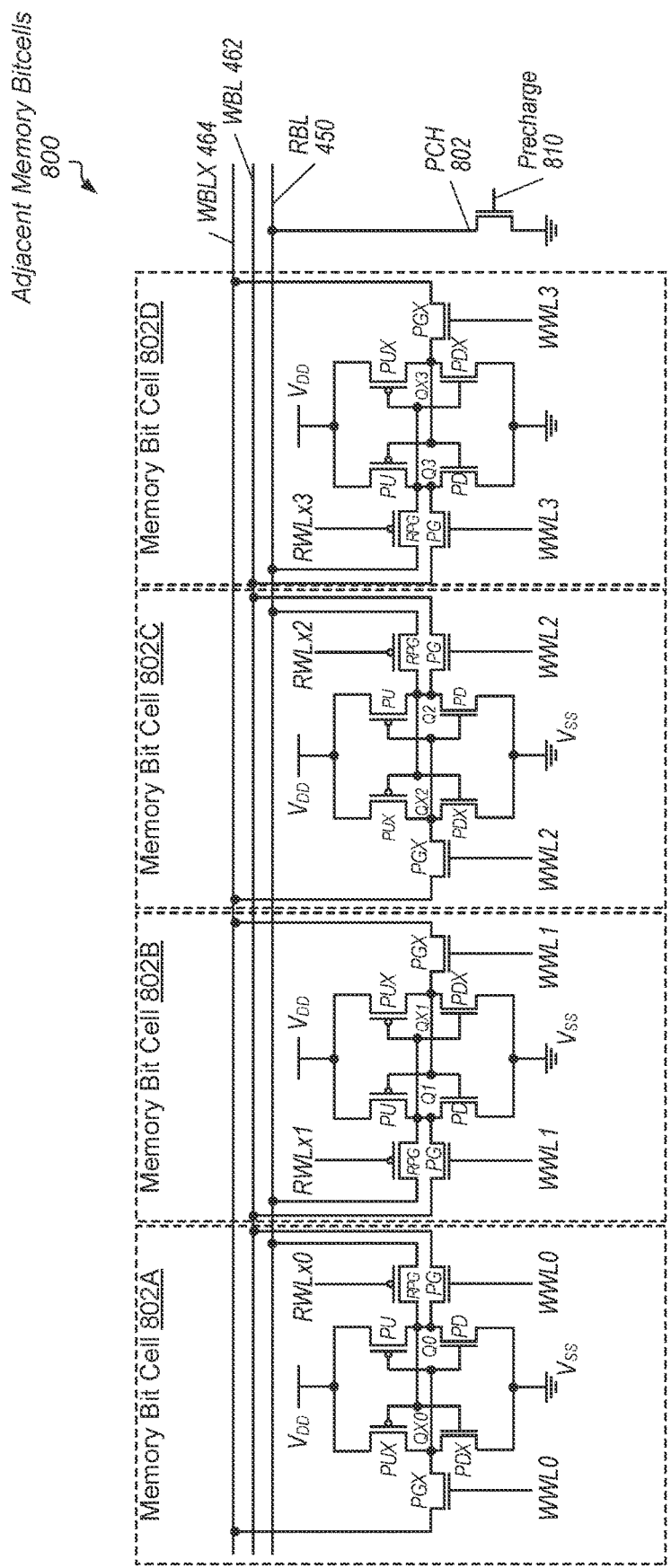
FIG. 8 is a generalized diagram of adjacent memory bit cells.

Turning to FIG. 8, a generalized block diagram of one implementation of adjacent memory bit cells 800 is shown. Signals, circuitry, and semiconductor layout components described earlier are numbered identically. Each of the memory bit cells 802A-802D uses the circuit topology of the memory bit cell 400 (of FIG. 4) that was described earlier. Similar labels are used, but the callouts used in the memory bit cell 400 are not included for ease of illustration. The memory bit cells 802A-802D are placed in a mirrored manner. In an implementation, an n n-type device PCH 802 receives the input signal Precharge 810, and precharges the read bit line RBL 450 to a ground reference voltage level.

Referring to FIG. 9, a generalized block diagram of one implementation of semiconductor layout 900 is shown. Signals, circuitry, and semiconductor layout components described earlier are numbered identically. The semiconductor layout 900 (or layout 900) is used for the adjacent memory bit cells 800 (of FIG. 8). Each of the memory bit cells 902A-902D uses the layout arrangement of the layout 470 (of FIG. 4) that was described earlier. Similar labels are used, but the callouts used in the layout 470 are not included here for ease of illustration. The use of each of a label "x" and an overbar above a label is used to indicate a complementary value. For example, the write bit line WBLx is a complementary value of the write bit line WBL. Similarly, the data storage node "Q1 with an overbar, such as $\overline{Q1}$, indicates a complementary value of the data storage node "Q1." The memory bit cells 902A-902D are placed in a mirrored manner. Between the cells 902B and 902C, the p-type diffusion is cut in order to avoid electrically connecting the two separate nodes between them.

The adjacent memory bit cells 800 and the layout 900 provide a 4-bit column of a memory array that uses a pattern of one or more p-type diffusion regions 202 and one or more n-type diffusion regions 204 used to define active regions that matches a pattern of standard cells used in I/O blocks of the memory array. Additionally, the use of the multiple read word lines for the multiple read ports do not cause the 4-bit column to expand beyond the pattern used by the standard cells used in I/O blocks of the memory array. Adjacent memory bit cells share source regions and drain regions at the nodes for the read bit line signals and the write bit line signals.

Figure 10:
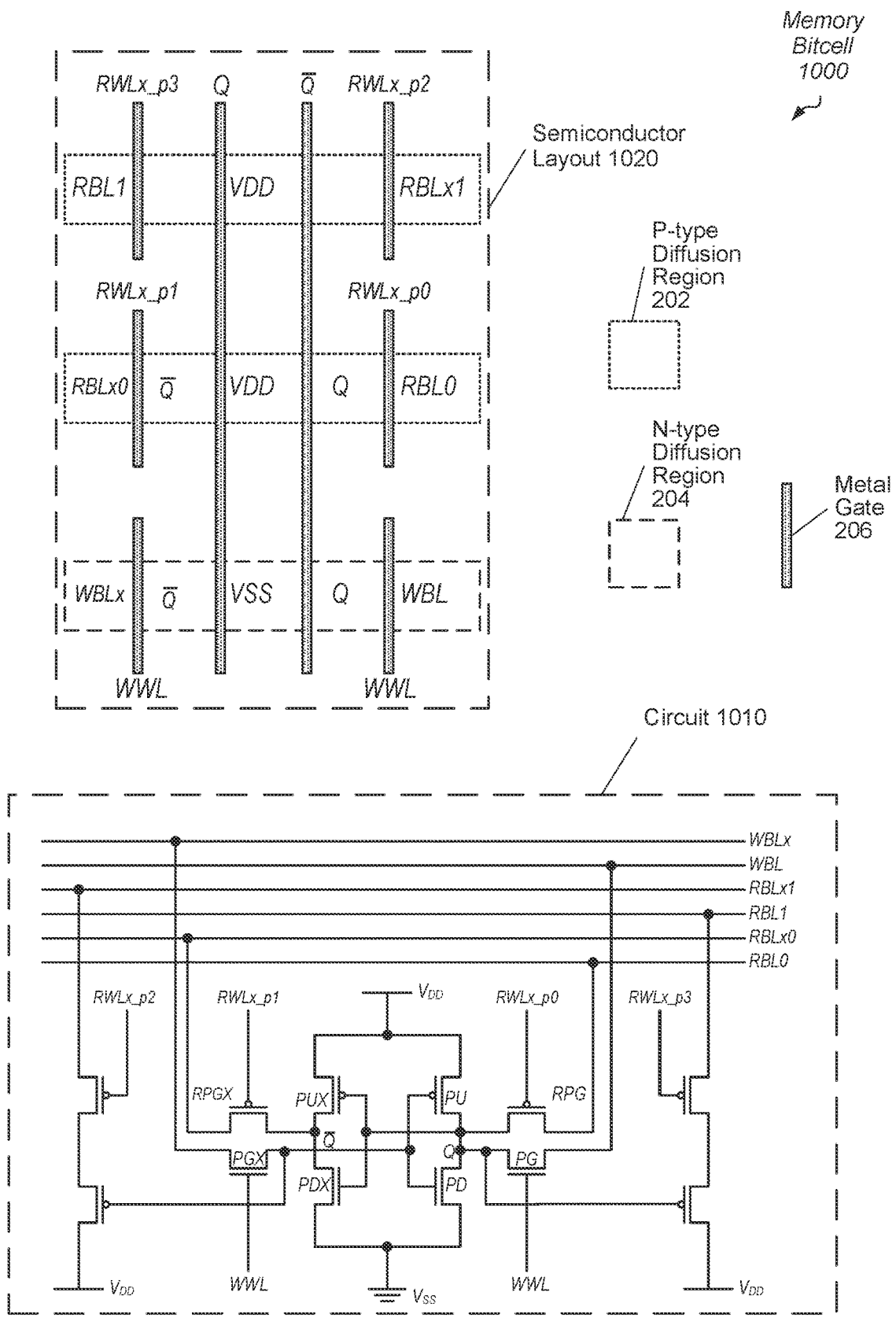
FIG. 10 is a generalized diagram of a memory bit cell.

Turning to FIG. 10, a generalized block diagram of one implementation of a memory bit cell 1000 is shown. Signals, circuitry, and semiconductor layout components described earlier are numbered identically. The semiconductor layout 1020 (or layout 1020) corresponds to the circuit diagram 1010. The circuit diagram 1010 uses the circuit topology of the memory bit cell 400 (of FIG. 4) that was described earlier, but also includes additional stacked p-type devices to provide additional read ports. Similar labels are used, but the callouts used in the memory bit cell 400 are not included for ease of illustration. The use of each of a label "x" and an overbar above a label is used to indicate a complementary value. The layout 1020 uses a similar layout arrangement of the layout 470 (of FIG. 4) that was described earlier, but layout 1020 includes additional read ports and two p-type diffusion regions used to define active regions. It is possible and contemplated that the additional stacked p-type devices providing additional read ports can be replaced with stacked n-type devices providing the additional read ports.

Figure 11:
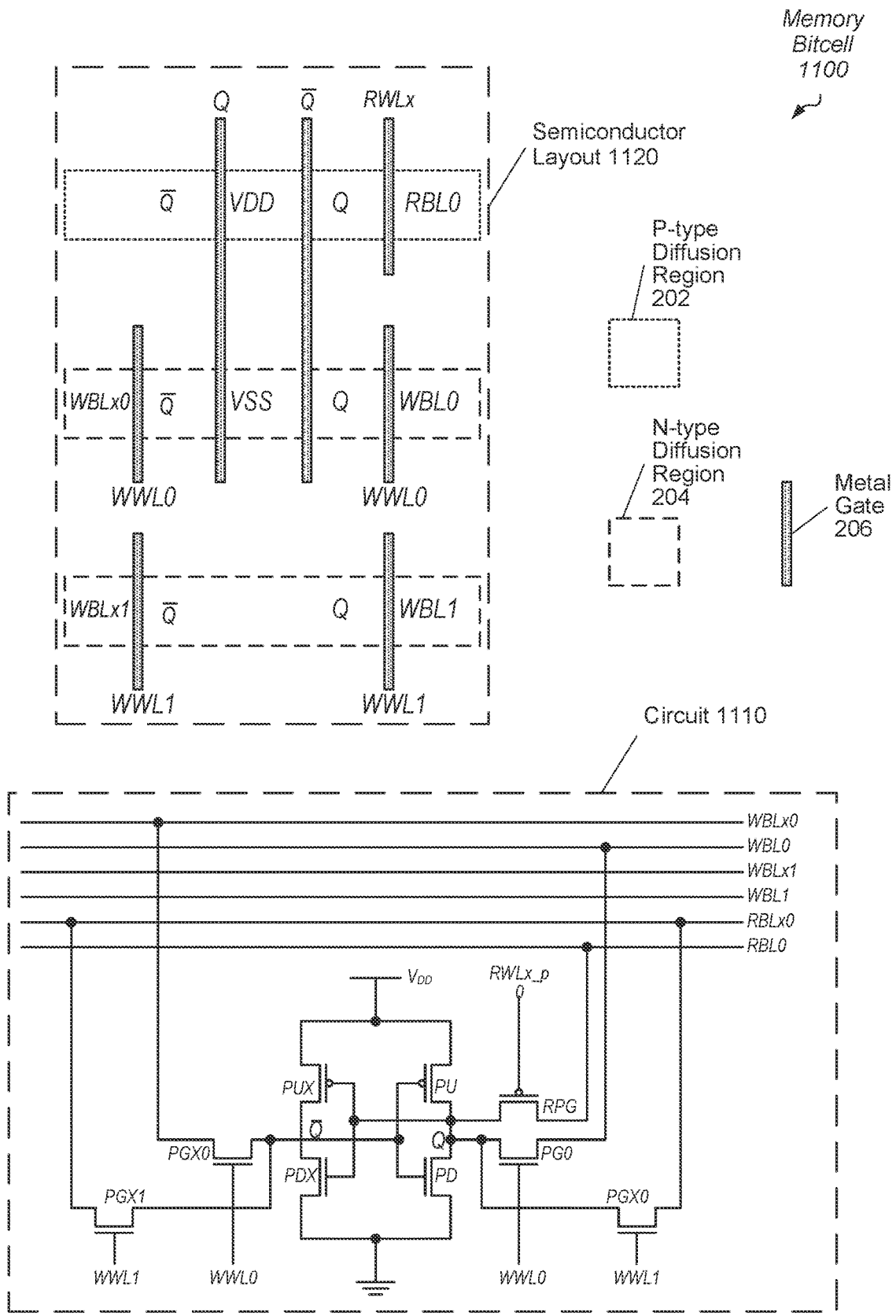
FIG. 11 is a generalized diagram of a memory bit cell.

Referring to FIG. 11, a generalized block diagram of one implementation of a memory bit cell 1100 is shown. Signals, circuitry, and semiconductor layout components described earlier are numbered identically. The semiconductor layout 1120 (or layout 1120) corresponds to the circuit diagram 1110. The circuit diagram 1110 uses the circuit topology of the memory bit cell 400 (of FIG. 4) that was described earlier, but also includes additional n-type devices to provide additional write ports. Similar labels are used, but the callouts used in the memory bit cell 400 are not included here for ease of illustration. The use of each of a label "x" and an overbar above a label is used to indicate a complementary value. The layout 1120 uses a similar layout arrangement of the layout 470 (of FIG. 4) that was described earlier, but layout 1120 includes additional write ports and two n-type diffusion regions used to define active regions.

Figure 12:
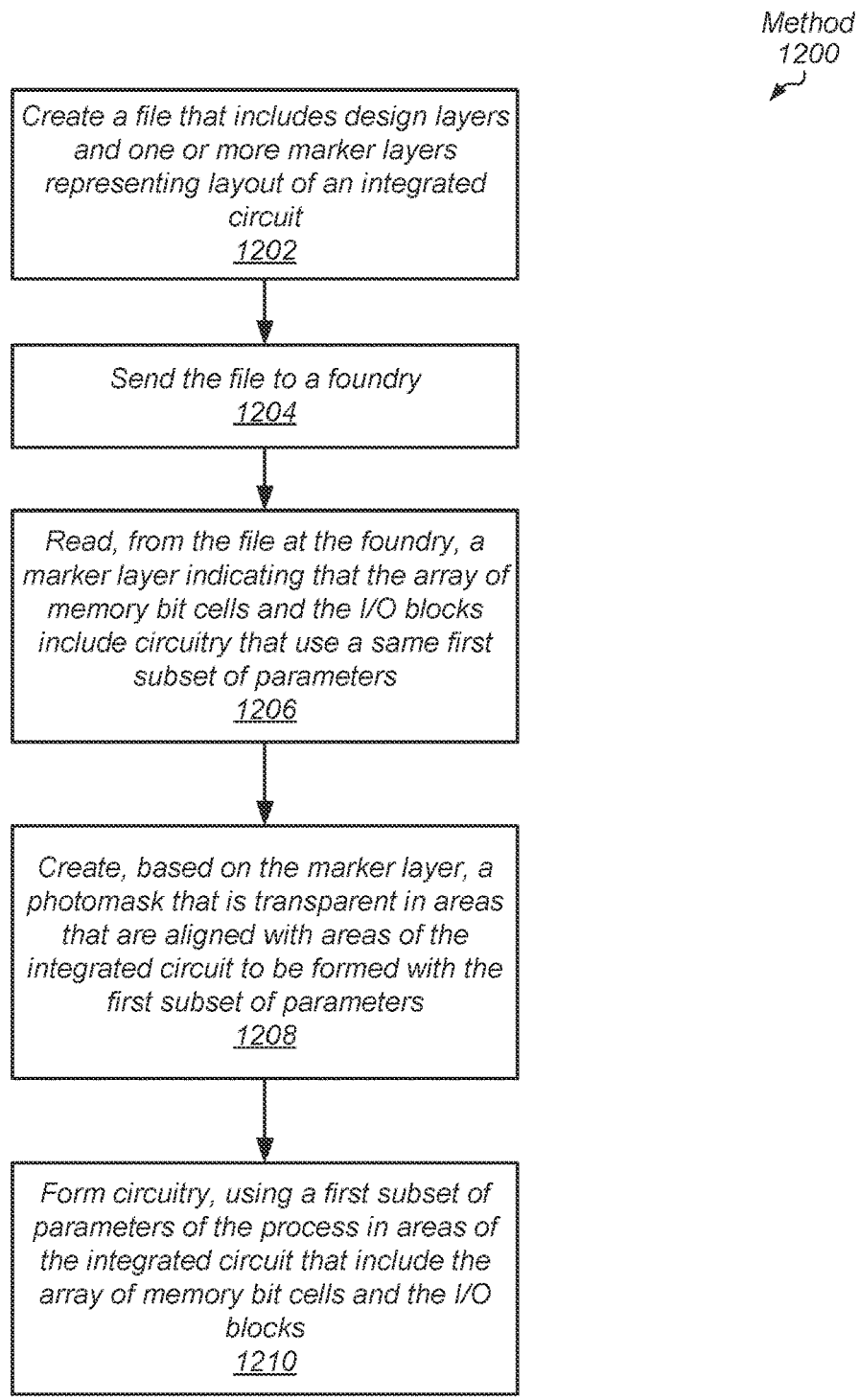
FIG. 12 is a generalized diagram of a method for creating layout for semiconductor chips.

Referring to FIG. 12, a generalized diagram is shown of a method 1200 creating layout for semiconductor chips. A design team creates a file that includes design layers and one or more marker layers representing layout of an integrated circuit (block 1202). The file with the mask layout data follows a particular file format. In an implementation, this file format is the Graphic Design System, which is also referred to as the Graphic Data System (GDS), file format. There is an updated file format called the GDSII file format. In an implementation, the file follows the GDSII file format. In various implementations, the design team uses a mask layout editor tool to draw either the transparent or the opaque patterns of the masks. Some of the masks are created manually while other masks are generated automatically from instantiations of cells from a library.

One of the created masks is a process mask that is a single mask used to define which circuitry of the integrated circuit being developed has a first subset of parameters of the semiconductor fabrication process. For example, the memory bit cells arranged as multiple rows and columns of an array in addition to I/O blocks, which are used to perform read accesses and write accesses, are placed in a manner that they are abutting one another. The created single mask identifies the array of memory bit cells and the I/O blocks as circuitry that use the same first subset of parameters. Examples of the first subset of parameters was provided earlier in the description of the memory banks 100 (of FIG. 1).

When the design of the integrated circuit being developed completes, the design team sends the file to an integration circuit foundry (block 1204). The integration circuit foundry (or foundry) receives the file and a processor within a desktop computer or a server at the foundry reads, from the file, a marker layer indicating that the array of memory bit cells and the I/O blocks include circuitry that use the same first subset of parameters. (block 1206). In an implementation, the marker layer includes information that identifies an area of a process mask that is opaque. The opaque portion of the process mask indicates areas of the integrated circuit that include the array of memory bit cells and the I/O blocks. In other implementations, a transparent portion of the process mask indicates areas of the integrated circuit that include the array of memory bit cells and the I/O blocks.

Based on the information of the marker layer, the foundry creates a fabrication mask (a photomask, or mask) that has a transparent pattern in areas that are aligned with areas of the integrated circuit that include the array of memory bit cells and the I/O blocks (block 1208). The foundry reads the marker layer information from a file, such as a GDSII file, and a laser exposes the pattern, which is provided in the file, on a quartz substrate that is chromium plated. Using this photomask, the foundry forms circuitry, using the first subset of parameters of the process, in areas of the integrated circuit that overlap the transparent pattern of the photomask (block 1210) such as the array of memory bit cells and the I/O blocks.

Figure 13:
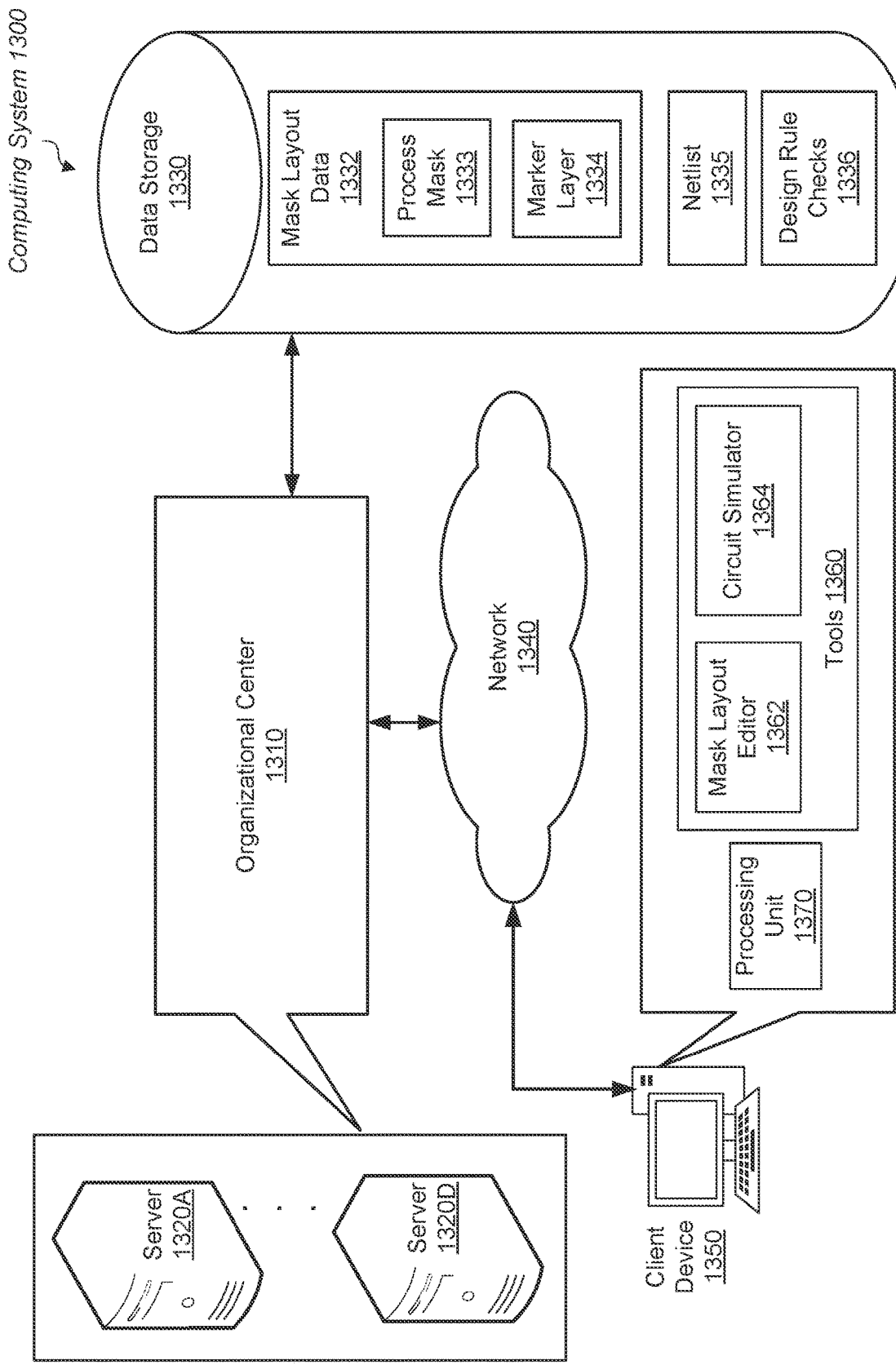
FIG. 13 is a generalized diagram of a computing system.

Referring to FIG. 13, a generalized block diagram of one implementation of a computing system 1300 is shown. In the illustrated implementation, the computing system 1300 includes the client computing device 1350, the servers 1320A-1320D that include hardware for executing software and supporting the organizational center 1310, a network 1340, and the data storage 1330 that includes one or more data stores supported and used by the organizational center 1310. Although a single client computing device 1350 is shown, any number of client computing devices utilize the organizational center 1310 through the network 1340. The client computing device 1350, which is also referred to as client device 1350, includes hardware, such as circuitry of a processor of the processing unit 1370, to execute instructions of tools 1360. The tools 1360 include at least the mask layout editor 1362 and the circuit simulator 1364. A designer uses the tools 1360 during the design of an integrated circuit. The designer uses the tools 1360 to build a circuit model, simulate the circuit model, create mask layout for the circuit model, and extract parasitic information from the mask layout for further simulation of the circuit model. The designer also uses the mask layout editor 1362 to create marker layers for the entire die of the integrated circuit. One example of these marker layers is a marker layer used to later generate the process corner mask for the integrated circuit. The designer uses the mask layout editor 1362 to create the process mask 1333 with a transparent pattern in a marker layer. The pattern information of this marker layer is provided in a file such as a GDSII file. When the design of the integrated circuit being developed completes, or a "tape out" has occurred for the integrated circuit, at least the process mask 1333 is sent to a foundry along with other mask layout data 1332 in one or more files such as GDSII files.

One or more of the tools 1360 use a copy of data stored in the data storage 1330. Examples of data used by the tools 1360 are copies of the netlist 1334 for both components and the entirety of the integrated circuit being designed. Additionally, the tools 1360 use at least a portion of the design rule checks (DRCs) 1336. The place-and-route tool (not shown) of the tools 1360 uses the netlist 1334 and a cell layout library that includes both synthesized and custom cells to provide physical layout of the integrated circuit being designed. A copy of the mask layout data 1332 is stored in one or more of the data storage 1330 and the client device 1350.

The client device 1350 includes a desktop computer or a mobile computing device such as a laptop, a tablet computer, and so forth. The client device 1350 includes hardware circuitry such as a processing unit 1370 for processing instructions of computer programs. In some implementations, the processing unit 1370 includes one or more homogeneous cores of a processor. In other implementations, the processing unit includes heterogeneous cores such as a parallel processing architected core and a general-purpose core as used in central processing units (CPUs). The parallel architected core is a graphics processing unit (GPU), a digital signal processing unit (DSP) or other.

The client device 1350 includes a network interface (not shown) supporting one or more communication protocols for data and message transfers through the network 1340. The network 1340 includes multiple switches, routers, cables, wireless transmitters and the Internet for transferring messages and data. Accordingly, the network interfaces of the organizational center 1310 and the client device 1350 support at least the Hypertext Transfer Protocol (HTTP) for communication across the World Wide Web. In addition to communicating with the client device 1350 through the network 1340, the organizational center 1310 also communicates with the data storage 1330 for storing and retrieving data.

In various implementations, the organizational center 1310 is an infrastructure for a vendor producing one or more hardware products. The organizational center 1310 includes an intranet network providing a private network accessible only to an organization's staff. An intranet portal is used to provide access to resources with a user-friendly interface such as graphical user interfaces (GUIs) and dashboards. The information and services made available by the organizational center 1310 is unavailable to the general public through direct access. Through user authentication, the staff members are able to access resources through the organizational center 1310 to communicate with other staff members, collaborate on projects and monitor product development, update products, documents and tools stored in a centralized repository and so forth.

The servers 1320A-1320D used for supporting the organizational center 1310 and resources accessed through the organizational center 1310 include a variety of server types such as database servers, computing servers, application servers, file servers, mail servers and so on. In various implementations, the servers 1320A-1320D and the client device 1350 operate with a client-server architectural model. The client device 1350 includes a copy of a particular version of a given software product or tool such as the tools 1360. In some implementations, the versions of the tools 1360 are based on at least the operating system and the processor(s) used by the client device 1350. As described earlier, the organizational center 1310 is an infrastructure for a vendor producing one or more hardware products. The integrated circuit is one of a variety of types of integrated circuits being developed for production.

Rather than use a single process mask for the entirety of the integrated circuit being developed, the designer(s) use the processing unit 1370 executing the mask layout editor 1362 to create the process mask 1333. In various implementations, the process mask 1333 is identified by the marker layer 1334 and defines the area of the integrated circuit being developed that includes circuitry of memory bit cells of an array and I/O blocks of the array that use the same first subset of parameters of the process. The absence of the gaps and boundary cells between the memory bit cells and the I/O blocks still satisfies the requirements of the DRCs 1336. Examples of the first subset of parameters was provided earlier in the description of the memory banks 100 (of FIG. 1).

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. A circuit comprising:
an array of memory bit cells for storing data arranged as a plurality of rows and a plurality of columns; and
first input/output (I/O) block abutting a first side of the array of memory bit cells; and
wherein:
each of the array of memory bit cells and the first I/O block includes base layers with a first subset of parameters of a semiconductor fabrication process, wherein the base layers are layers between a silicon substrate layer and a signal interconnect metal layer closest to the silicon substrate layer; and
in response to receiving, from the first I/O block, an indication of a read operation targeting a given row of the plurality of rows comprising a first memory bit cell, the array of memory bit cells is configured to convey first data stored in the first memory bit cell.

2. The circuit as recited in claim 1, wherein the first subset of parameters comprises a repeatable pattern of one or more p-type diffusion regions and one or more n-type diffusion regions used to define active regions of a plurality of standard cells in a standard cell library.

3. The circuit as recited in claim 2, wherein the repeatable pattern comprises a given width for each of the one or more p-type diffusion regions and one or more n-type diffusion regions allowing a same number of Fins to be formed over one or more memory bit cells of the array and one or more cells of the first I/O block.

4. The circuit as recited in claim 1, wherein read access circuitry of the first memory bit cell comprises only p-type transistors.

5. The circuit as recited in claim 4, wherein a number of contacted gate pitches (CPP) of the first memory bit cell is four.

6. The circuit as recited in claim 1, further comprising a second I/O block abutting a second side of the array of memory bit cells different from the first side, wherein the second I/O block:
is configured to receive the first data stored in the first memory bit cell; and
comprises the first subset of parameters.

7. The circuit as recited in claim 1, wherein write access circuitry of the first memory bit cell comprises n-type transistors with a first threshold voltage less than a second threshold voltage of p-type transistors of data storage circuitry of the first memory bit cell.

8. A method comprising:
storing data in an array of memory bit cells arranged as a plurality of rows and a plurality of columns with a first input/output (I/O) block abutting a first side of the array of memory bit cells; and
wherein:
each of the array of memory bit cells and the first I/O block includes base layers with a first subset of parameters of a semiconductor fabrication process, wherein the base layers are layers between a silicon substrate layer and a signal interconnect metal layer closest to the silicon substrate layer; and
in response to receiving, from the first I/O block, an indication of a read operation targeting a given row of the plurality of rows comprising a first memory bit cell, conveying, by the array of memory bit cells, first data stored in the first memory bit cell.

9. The method as recited in claim 8, wherein the first subset of parameters comprises a repeatable pattern of one or more p-type diffusion regions and one or more n-type diffusion regions used to define active regions of a plurality of standard cells in a standard cell library.

10. The method as recited in claim 9, wherein the repeatable pattern comprises a given width for each of the one or more p-type diffusion regions and one or more n-type diffusion regions allowing a same number of Fins to be formed over one or more memory bit cells of the array and one or more cells of the first I/O block.

11. The method as recited in claim 8, wherein read access circuitry of the first memory bit cell comprises only p-type transistors.

12. The method as recited in claim 11, wherein a number of contacted gate pitches (CPP) of the first memory bit cell is four.

13. The method as recited in claim 9, further comprising receiving the first data stored in the first memory bit cell by a second I/O block abutting a second side of the array of memory bit cells different from the first side, wherein the second I/O block comprises the first repeatable pattern of one or more p-type diffusion regions and one or more n-type diffusion regions.

14. The method as recited in claim 8, wherein write access circuitry of the first memory bit cell comprises n-type transistors with a first threshold voltage less than a second threshold voltage of p-type transistors of data storage circuitry of the first memory bit cell.

15. A computing system comprising
a memory configured to store instructions of one or more tasks and source data to be processed by the one or more tasks; and
an integrated circuit configured to execute the instructions using the source data, wherein the integrated circuit comprises:
an array of memory bit cells for storing data arranged as a plurality of rows and a plurality of columns; and
first input/output (I/O) block abutting a first side of the array of memory bit cells; and
wherein:
each of the array of memory bit cells and the first I/O block includes base layers with a first subset of parameters of a semiconductor fabrication process, wherein the base layers are layers between a silicon substrate layer and a signal interconnect metal layer closest to the silicon substrate layer; and
in response to receiving, from the first I/O block, an indication of a read operation targeting a given row of the plurality of rows comprising a first memory bit cell, the array of memory bit cells is configured to convey first data stored in the first memory bit cell.

16. The computing system as recited in claim 15, wherein the first subset of parameters comprises a repeatable pattern of one or more p-type diffusion regions and one or more n-type diffusion regions used to define active regions of a plurality of standard cells in a standard cell library.

17. The computing system as recited in claim 16, wherein the repeatable pattern comprises a given width for each of the one or more p-type diffusion regions and one or more n-type diffusion regions allowing a same number of fins to be formed over one or more memory bit cells of the array and one or more cells of the first I/O block.

18. The computing system as recited in claim 15, wherein read access circuitry of the first memory bit cell comprises only p-type transistors.

19. The computing system as recited in claim 18, wherein a number of contacted gate pitches (CPP) of the first memory bit cell is four.

20. The computing system as recited in claim 16, wherein the integrated circuit further comprises a second I/O block abutting a second side of the array of memory bit cells different from the first side, wherein the second I/O block:
- is configured to receive the first data stored in the first memory bit cell; and
- comprises the repeatable pattern of one or more p-type diffusion regions and one or more n-type diffusion regions.

\* \* \* \* \*